(12) United States Patent
Shim et al.

(10) Patent No.: US 11,770,929 B2
(45) Date of Patent: Sep. 26, 2023

(54) VERTICAL MEMORY DEVICES WITH SEGMENTED CHARGE STORAGE LAYERS

(71) Applicant: SAMSUNG ELECTRONICS CO., LTD., Suwon-si (KR)

(72) Inventors: Sunil Shim, Seoul (KR); Suhyeong Lee, Suwon-si (KR); Taisoo Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 200 days.

(21) Appl. No.: 16/993,345

(22) Filed: Aug. 14, 2020

(65) Prior Publication Data

US 2021/0151461 A1    May 20, 2021

(30) Foreign Application Priority Data

Nov. 18, 2019    (KR) .................. 10-2019-0147800

(51) Int. Cl.
*H10B 43/27*    (2023.01)
*H01L 21/28*    (2006.01)
(Continued)

(52) U.S. Cl.
CPC ........ *H10B 43/27* (2023.02); *H01L 29/40114* (2019.08); *H01L 29/40117* (2019.08);
(Continued)

(58) Field of Classification Search
CPC ........... H01L 27/11524; H01L 27/1157; H01L 27/11556; H01L 29/40117; H01L 29/4234;
(Continued)

(56) References Cited

U.S. PATENT DOCUMENTS 9,263,596 B2    2/2016    Yoo
2014/0193966 A1    7/2014    You et al.
(Continued)

OTHER PUBLICATIONS

Shin Yokoyama, et al. "Low-temperature selective deposition of silicon on silicon nitride by time-modulated disilane flow and formation of silicon narrow wires" Appl. Phys. Lett. 79, 494-496 pages (2001).

(Continued)

*Primary Examiner* — Wasiul Haider
(74) *Attorney, Agent, or Firm* — Lee IP Law, P.C.

(57) ABSTRACT

A semiconductor device includes gate layers stacked on a substrate in a first direction perpendicular to an upper surface of the substrate, and channel structures penetrating the gate layers and extending in the first direction, each of the channel structures includes first dielectric layers on side surfaces of the gate layers, respectively, and spaced apart from each other in the first direction, electric charge storage layers on side surfaces of the first dielectric layers, respectively, and spaced apart from each other in the first direction, a second dielectric layer extending perpendicularly to the substrate to conform to side surfaces of the electric change storage layers, and a channel layer extending perpendicularly, and each of the first dielectric layers has a first maximum length, and each of the electric charge storage layers has a second maximum length greater than the first maximum length in the first direction.

20 Claims, 44 Drawing Sheets

A

(51) Int. Cl.
*H01L 29/423* (2006.01)
*H10B 41/27* (2023.01)
*H10B 41/35* (2023.01)
*H10B 43/35* (2023.01)

(52) U.S. Cl.
CPC .... *H01L 29/4234* (2013.01); *H01L 29/42324* (2013.01); *H10B 41/27* (2023.02); *H10B 41/35* (2023.02); *H10B 43/35* (2023.02)

(58) Field of Classification Search
CPC .......................... H01L 27/11521–11529; H01L 27/11563–11582
See application file for complete search history.

(56) References Cited

U.S. PATENT DOCUMENTS

| | | | |
|---|---|---|---|
| 2014/0332873 A1* | 11/2014 | Yoo | H01L 27/11556 257/314 |
| 2015/0333186 A1* | 11/2015 | Yoo | H01L 29/40117 257/324 |
| 2016/0225786 A1 | 8/2016 | Lee et al. | |
| 2016/0351581 A1* | 12/2016 | Ahn | H01L 27/1157 |
| 2017/0133393 A1 | 5/2017 | Yamashita | |
| 2017/0250193 A1 | 8/2017 | Huo | |
| 2018/0006041 A1 | 1/2018 | Xu et al. | |
| 2018/0033799 A1 | 2/2018 | Kanamori et al. | |
| 2018/0374860 A1* | 12/2018 | Goda | H01L 27/11582 |

OTHER PUBLICATIONS

German Office action dated Jul. 21, 2022 for corresponding DE Application No. 102020126242.6.

* cited by examiner

VERTICAL MEMORY DEVICES WITH SEGMENTED CHARGE STORAGE LAYERS

CROSS-REFERENCE TO RELATED APPLICATION

Korean Patent Application No. 10-2019-0147800, filed on Nov. 18, 2019, in the Korean Intellectual Property Office, and entitled: "Semiconductor Devices," is incorporated by reference herein in its entirety.

BACKGROUND

1. Field

Example embodiments relate to a semiconductor device.

2. Description of the Related Art

A semiconductor device may be required to have a reduced volume and to process high capacity data. Accordingly, it may be necessary to increase integration density of a semiconductor element included in such a semiconductor device. As one method of improving integration density of a semiconductor device, a semiconductor device having a vertical transistor structure, instead of a general planar transistor structure, may be suggested.

SUMMARY

According to an example embodiment, a semiconductor device includes gate layers stacked on a substrate and spaced apart from each other in a first direction perpendicular to an upper surface of the substrate; interlayer insulating layers alternatively stacked with the gate layers on the substrate; and channel structures penetrating the gate layers and extending in the first direction, each of the channel structures includes first dielectric layers disposed on side surfaces of the gate layers, respectively, and spaced apart from each other in the first direction, electric charge storage layers disposed on side surfaces of the first dielectric layers, respectively, and spaced apart from each other in the first direction, a second dielectric layer extending perpendicularly to the substrate to conform to side surfaces of the electric charge storage layers, and a channel layer extending perpendicularly to the substrate on a side surface of the second dielectric layer, and each of the first dielectric layers has a first maximum length in the first direction, and each of the electric charge storage layers has a second maximum length greater than the first maximum length in the first direction.

According to an example embodiment, a semiconductor device includes gate layers vertically stacked on a substrate and spaced apart from each other; interlayer insulating layers alternately stacked with the gate layers on the substrate; and channel structures each including first dielectric layers, first electric charge storage layers, a second dielectric layer, and a channel layer, which fill channel holes penetrating the gate layers and extending perpendicularly to the substrate and are stacked sequentially from side surfaces of the gate layers, the first dielectric layers and the first electric charge storage layers are separated from each other between the gate layers vertically adjacent to each other, the first dielectric layers are disposed on the side surfaces of the gate layers such that the first dielectric layers do not extend to side surfaces of the interlayer insulating layers, and the first dielectric layers have rounded surfaces protruding and curved towards the channel layer, respectively, and the first electric charge storage layers are disposed on a portion of the rounded surfaces of the first dielectric layers.

According to an example embodiment, a semiconductor device includes gate layers vertically stacked on a substrate and spaced apart from each other; interlayer insulating layers alternately stacked with the gate layers on the substrate; a channel layer penetrating the gate layers and extending perpendicularly to an upper surface of the substrate; first dielectric layers disposed on side surfaces of the gate layers, respectively, between the gate layers and the channel layer; electric charge storage layers disposed on side surfaces of the first dielectric layers, respectively, between the first dielectric layers and the channel layer; and a second dielectric layer disposed between the electric charge storage layers and the channel layer, and at least a portion of the first dielectric layers is in contact with the second dielectric layer.

BRIEF DESCRIPTION OF DRAWINGS

Features will become apparent to those of skill in the art by describing in detail exemplary embodiments with reference to the attached drawings in which.

DETAILED DESCRIPTION

Figure 1:
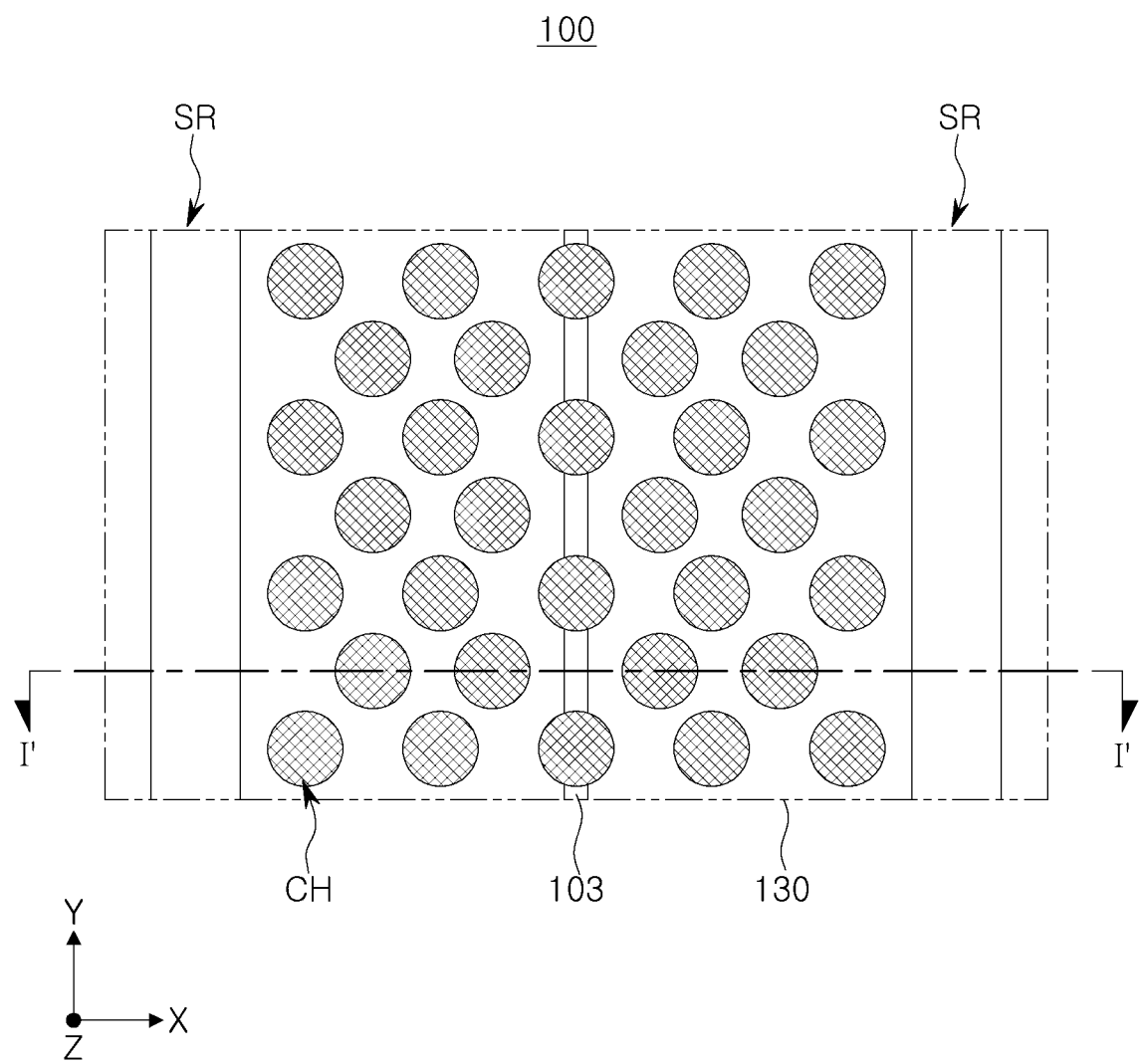
FIG. 1 is a schematic plan view illustrating a semiconductor device according to an example embodiment.
Figure 2:
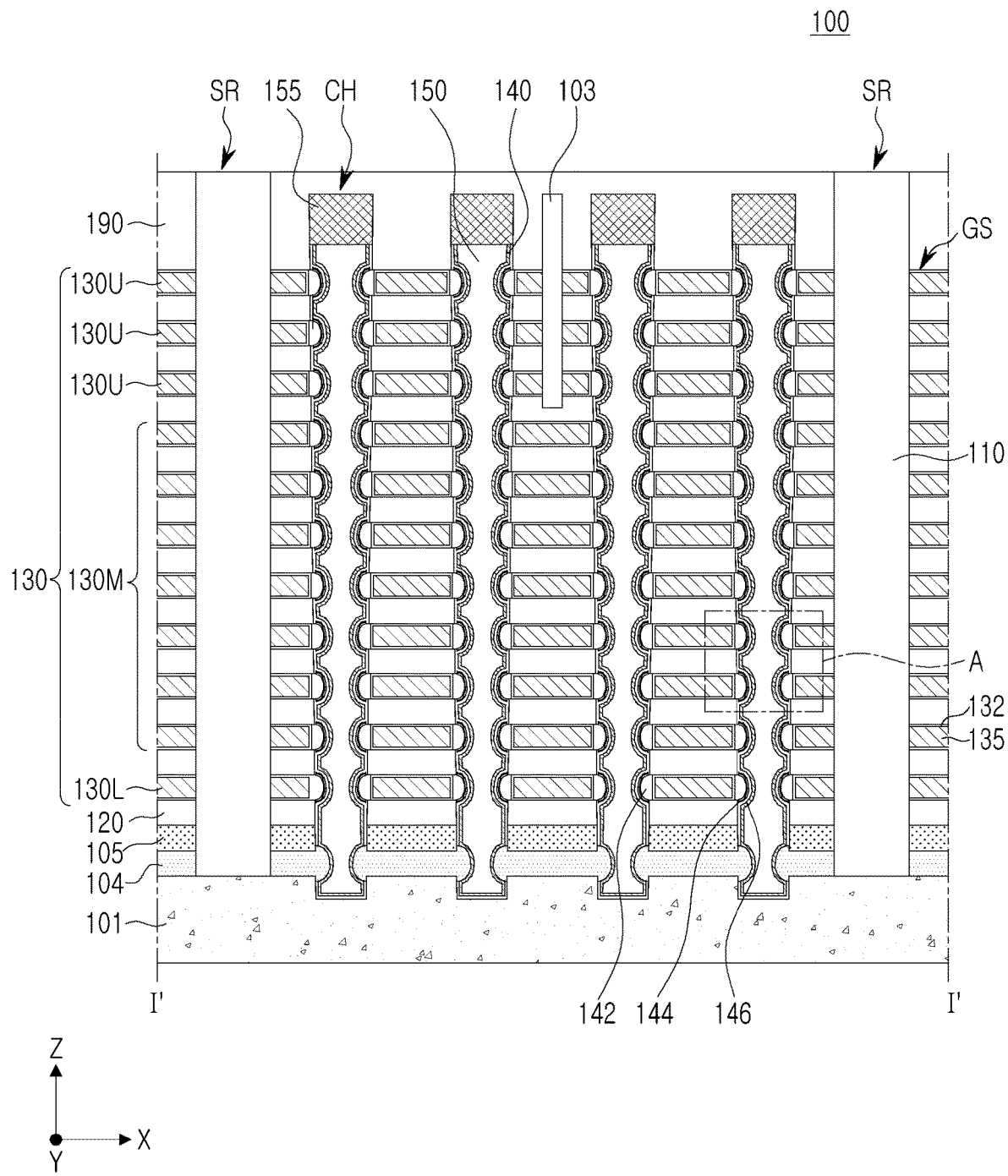
FIG. 2 is a schematic cross-sectional view illustrating a semiconductor device according to an example embodiment.
Figure 3A:
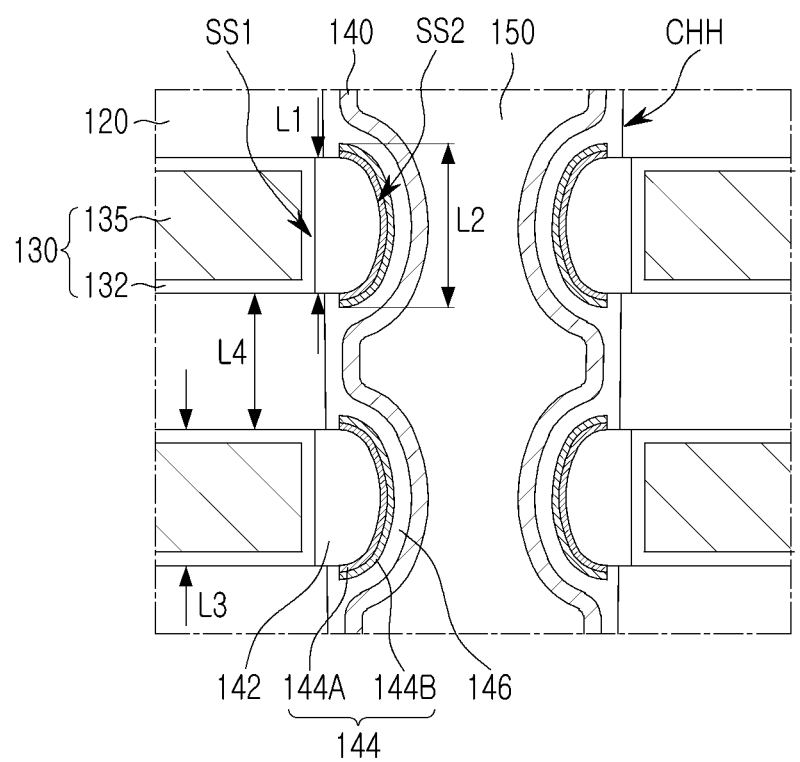
FIGS. 3A and 3B are schematic enlarged views illustrating a semiconductor device according to an example embodiment.
Figure 3B:
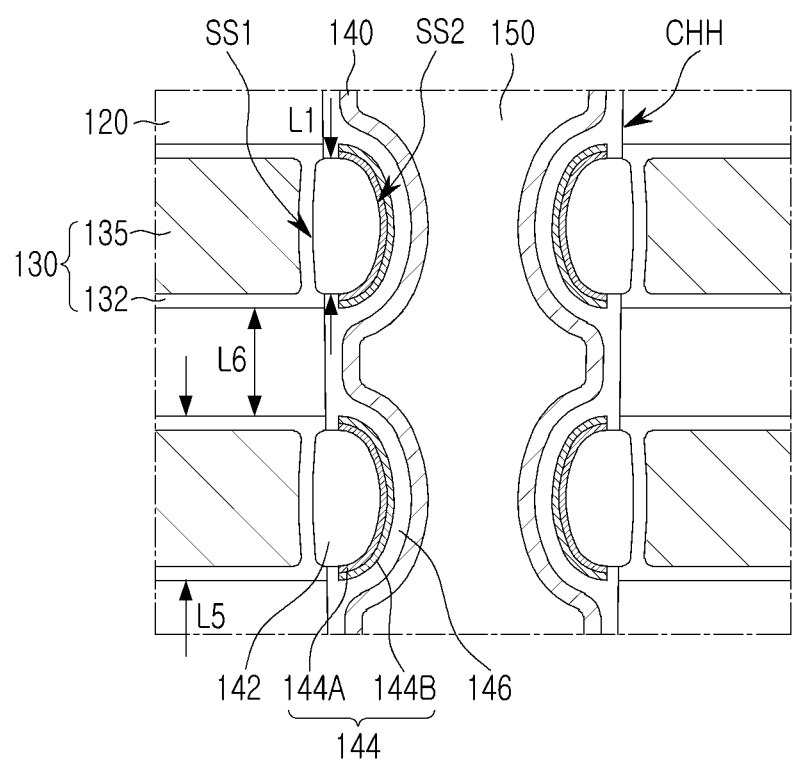

FIG. 1 is a schematic plan view illustrating a semiconductor device according to an example embodiment. FIG. 2 is a schematic cross-sectional view along line I-I' in FIG. 1. FIGS. 3A and 3B are schematic enlarged cross-sectional views of region "A" in FIG. 2.

Referring to FIGS. 1 to 3A, a semiconductor device 100 may include a substrate 101, gate layers 130 vertically stacked on the substrate 101 and spaced apart from each other, e.g., along the z direction, interlayer insulating layers 120 alternately stacked with the gate layers 130, and channel structures CH with channel layers 140 penetrating the gate layers 130 to extend in a direction perpendicular to an upper surface of the substrate 101, e.g., along the z direction. The alternating interlayer insulating layers 120 and gate layers 130 define a stack structure GS, and separation regions SR may penetrate the stack structure GS of the interlayer insulating layers 120 and the gate layers 130, e.g., along the z direction.

Each of the channel structures CH may include first dielectric layers 142 disposed on side surfaces of the gate layers 130 and spaced apart from each other in the z direction perpendicular to an upper surface of the substrate 101, electric charge storage layers 144 disposed on side surfaces of the first dielectric layers 142, respectively, and spaced apart from each other in the z direction, a second dielectric layer 146 extending in the z direction to conform to side surfaces of the electric charge storage layers 144, and the channel layer 140 extending in the z direction on a side surface of the second dielectric layer 146. The semiconductor device 100 may further include first and second horizontal conductive layers 104 and 105 disposed between the substrate 101 and the interlayer insulating layers 120, separation insulating layers 110 disposed in the separation regions SR, and a cell region insulating layer 190 covering the gate layers 130.

In the semiconductor device 100, a plurality of memory cell strings may be configured around each of the channel structures CH, and the plurality of memory cell strings may be arranged in an x direction and a y direction to form columns and rows.

The substrate 101 may have an upper surface extending in the x direction and the y direction. The substrate 101 may include a semiconductor material, e.g., a group IV semiconductor, a group III-V compound semiconductor, or a group II-VI compound semiconductor. For example, a group IV semiconductor may include silicon, germanium, silicon-gallium, or the like. The substrate 101 may be provided as, e.g., a bulk wafer, an epitaxial layer, a silicon on insulator (SOI) layer, or a semiconductor on insulator (SeOI) layer, or the like.

The gate layers 130 may be stacked vertically on the substrate 101, and the gate layers 130 and the interlayer insulating layers 120 may be included in the stack structure GS. The gate layers 130 may include a lower gate layer 130L constituting a gate of a ground select transistor, memory gate layers 130M constituting a plurality of memory cells, and upper gate layers 130U constituting a gate of a string select transistor. The number of the memory gate layers 130M constituting memory cells may be determined in accordance with capacity of the semiconductor device 100. In example embodiments, the number of each of the upper and lower gate layers 130U and 130L constituting a string select transistor and a ground select transistor may be one or two, and each of the upper and lower gate layers 130U and 130L may have a structure the same as or different from a structure of each of the gate layers 130 constituting memory cells. Also, in example embodiments, the gate layers 130 may further include a gate layer 130 disposed in an upper portion of the upper gate layers 130U constituting the string select transistor and constituting an erase transistor used for an erase operation using a gate induced drain leakage (GIDL) mechanism. A portion of the gate layers 130, memory gate layers 130M adjacent to the upper and lower gate layers 130U and 130L, for example, may be configured as dummy gate layers.

The gate layers 130 may be stacked vertically on the substrate 101 and may be spaced apart from each other, and may be separated from each other in the x direction by the separation regions SR extending in the y direction. The gate layers 130 disposed between a pair of separation regions SR may constitute a single memory block, but an example embodiment of the memory block is not limited thereto. A portion of the gate layers 130, e.g., each of the memory gate layers 130M, may form a single layer in a single memory block.

For example, as illustrated in FIG. 3A, the gate layers 130 may include gate conductive layers 135 and gate dielectric layers 132 surrounding the gate conductive layers 135. In another example, the gate layers 130 may not include the gate dielectric layers 132 and may only include the gate conductive layers 135. For example, the gate conductive layers 135 may include a metal material, e.g., tungsten (W). In another example, the gate conductive layers 135 may include polycrystalline silicon or a metal silicide material. In example embodiments, the gate conductive layers 135 may further include a diffusion barrier on an external side, and the diffusion barrier may include, e.g., tungsten nitride (WN), tantalum nitride (TaN), titanium nitride (TiN), or combinations thereof. The gate dielectric layers 132 may include silicon oxide ($SiO_2$), silicon nitride ($Si_3N_4$), silicon oxynitride (SiON), a high-k material, or combinations thereof. A high-k material may refer to a dielectric material having a dielectric constant higher than that of silicon oxide ($SiO_2$). A high-k material may be one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$), for example.

The interlayer insulating layers 120 may be disposed between the gate layers 130. The interlayer insulating layers 120 may also be spaced apart from each other in a direction perpendicular to an upper surface of the substrate 101, similarly to the gate layers 130. The interlayer insulating layers 120 may include an insulating material, e.g., silicon oxide or silicon nitride. The interlayer insulating layers 120 may have substantially planar upper and lower surfaces. In the separation regions SR, side surfaces of the interlayer insulating layers 120 may be coplanar with side surfaces of the gate layers 130, but an example embodiment thereof is not limited thereto. In an example embodiment, the side surfaces of the interlayer insulating layers 120 may be formed to protrude toward the separation regions SR from the side surfaces of the gate layers 130.

The first and second horizontal conductive layers 104 and 105 may be stacked on an upper surface of the substrate 101. At least a portion of the first and second horizontal conductive layers 104 and 105 may function as a common source line of the semiconductor device 100 and may function as a common source line along with the substrate 101. The first horizontal conductive layer 104 may be directly connected to the channel layer 140 on a circumference of the channel structures CH. The first horizontal conductive layer 104 may have a rounded end or a rounded side surface, curved towards the channel layer 140. The above-described structure may be formed because a portion of a second horizontal sacrificial layer 112 may be oxidized along with sacrificial layers 180 in a manufacturing process, described with reference to FIG. 12B below. In example embodiments, the first horizontal conductive layer 104 may have a planar side surface.

The first and second horizontal conductive layers 104 and 105 may include a semiconductor material, e.g., polycrystalline silicon. In this case, at least the first horizontal conductive layer 104 may be configured as a doped layer, and the second horizontal conductive layer 105 may be a doped layer or a layer including impurities diffused from the first horizontal conductive layer 104.

Each of the channel structures CH may constitute a single memory cell string, and may be disposed to form rows and columns on the substrate 101 and may be spaced apart from each other. The channel structures CH may be disposed in a lattice pattern, or in a zigzag pattern in one direction. Each of the channel structures CH may have, e.g., a cylindrical shape, and may have an inclined side surface such that a width of each of the channel structures CH may decrease towards the substrate 101 in accordance with an aspect ratio. Each of the channel structures CH may include the first dielectric layers 142, the electric charge storage layers 144, the second dielectric layer 146, the channel layer 140, a channel insulating layer 150, and a channel pad 155, which fill a channel hole CHH. In the following figures, a thickness of each of the first dielectric layer 142, the electric charge storage layers 144, the second dielectric layer 146, and the channel layer 140 is one example, and is not limited thereto.

The channel layer 140 may be formed to have an annular shape surrounding the channel insulating layer 150 disposed therein, but an example embodiment thereof is not limited thereto. In an example embodiment, the channel layer 140 may have a pillar shape, e.g., a cylindrical shape or a prism shape. The channel layer 140 may be connected to the first horizontal conductive layer 104 in a lower portion. The channel layer 140 may include a semiconductor material, e.g., polycrystalline silicon or single crystalline silicon, and the semiconductor material may be, e.g., an undoped material or a material including p-type or n-type impurities. The channel structures CH disposed on a linear line in the x direction between a pair of the separation regions SR may be connected to different bit lines in accordance with an arrangement of an upper wiring structure connected to the channel pad 155.

The first dielectric layers 142 may be respectively disposed between the electric charge storage layers 144 and the gate layers 130 on side surfaces of the gate layers 130, may be separated from each other between the gate layers 130 vertically adjacent to each other, and may be disposed as a plurality of layers in a single channel structure CH. For example, as illustrated in FIG. 3A, each first dielectric layer 142 may be positioned between a lateral side of a respective gate layer 130 and a corresponding electric charge storage layer 144, while two first dielectric layer 142 adjacent to each other along the z direction may be spaced apart, e.g., completely separated (or discontinuous), from each other, e.g., by a portion of an interlayer insulating layer 120 and a portion of the second dielectric layer 146. The first dielectric layers 142 may be formed to protrude into the channel holes CHH. Accordingly, a distance from the side surfaces of the interlayer insulating layers 120 to a central axis of the channel holes CHH may be greater than a distance from the side surfaces of the first dielectric layers 142 facing the electric charge storage layers 144 to a central axis of the channel holes CHH.

In detail, in the first dielectric layer 142, a first surface SS1, i.e., a surface facing the gate layers 130, may be in, e.g., direct, contact with the gate layer 130, e.g., the first dielectric layer 142 may be in contact with the gate dielectric layer 132 of the gate layer 130. A second surface SS2, i.e., a surface facing the channel layer 140, may have a rounded shape curved toward a central axis of the channel structure CH or the channel layer 140, and may be in, e.g., direct, contact with the electric charge storage layers 144. In the first dielectric layer 142, an upper surface and a lower surface between the first surface SS1 and the second surface SS2 may be in contact with the second dielectric layer 146. The upper surface and the lower surface may extend substantially in parallel to an upper surface of the substrate 101, or may have a rounded shape along with the second surface SS2. The first surface SS1 may not be coplanar with the side surfaces of the interlayer insulating layers 120, and may be shifted from the side surfaces of the interlayer insulating layers 120 toward the gate layers 130, but an example embodiment thereof is not limited thereto. Accordingly, a portion of the first dielectric layers 142 may be configured to overlap the interlayer insulating layers 120 on a plan-view or in the z direction.

The first dielectric layers 142 may only be disposed on the side surfaces of the gate layers 130 in a limited manner such that the first dielectric layers 142 may not extend to the side surfaces of the interlayer insulating layers 120, e.g., the first dielectric layers 142 may not overlap surfaces of the interlayer insulating layers 120 that face the channel layer 140. Accordingly, a first maximum length L1 of the first dielectric layer 142 in the z direction may be the same as or smaller than a third maximum length L3 of the gate layer 130 in the z direction. However, an example embodiment thereof is not limited thereto.

For example, as illustrated in FIG. 3B, the gate layer 130 may have an enlarged shape in the z direction. In this case, the gate layer 130 may have a fifth maximum length L5 greater than the third maximum length L3, and each of the interlayer insulating layers 120 may have a sixth maximum length L6 smaller than a fourth maximum length L4 illustrated in FIG. 3A. In the example embodiment illustrated in FIG. 3B, the first maximum length L1 of the first dielectric layer 142 may be less than the fifth maximum length L5 of the gate layer 130. Accordingly, at least a portion of the upper surfaces and the lower surfaces of the first dielectric layers 142 may be in contact with the gate layer 130. Also, the first surface SS1 may have a rounded shape curved toward the gate layer 130, but an example embodiment thereof is not limited thereto. In the example embodiments described below, the gate layers 130 may expand in the z direction as illustrated in FIG. 3B, and accordingly, a shape of the first dielectric layer 142 in contact with the gate layer 130 may be partially changed.

The first dielectric layers 142 may include, e.g., silicon oxide ($SiO_2$), silicon nitride ($Si_3N_4$), silicon oxynitride (SiON), a high-k material, or combinations thereof. The first dielectric layers 142 may include a material different from a material of the gate dielectric layers 132. For example, the first dielectric layers 142 may include silicon oxide ($SiO_2$), and the gate dielectric layers 132 may include aluminum oxide ($Al_2O_3$).

The electric charge storage layers 144 may be disposed between the first dielectric layer 142 and the second dielectric layer 146 on the second surface SS2 of the first dielectric layer 142, may be separated from each other between the gate layers 130 vertically adjacent to each other, and may be disposed as a plurality of layers in a single channel structure CH. The electric charge storage layers 144 may be spaced apart from the interlayer insulating layers 120, and may be disposed in at least a portion of the second surface SS2 other than the upper and lower surfaces of the first dielectric layer 142, e.g., each electric charge storage layer 144 may be conformal on the second surface SS2. Accordingly, a surface of each of the electric charge storage layers 144 facing the channel layer 140 may have a rounded shape curved toward a central axis of the channel structure CH or toward the channel layer 140, and may be in contact with the second dielectric layer 146. Each electric charge storage layer 144 may be entirely surrounded, e.g., enclosed, by the first dielectric layers 142 and the second dielectric layer 146. For example, as illustrated in FIG. 3A, two electric charge storage layers 144 adjacent to each other along the z direction may be spaced apart, e.g., completely separated, from each other by a portion of the second dielectric layer 146.

Each electric charge storage layer 144 may have a second maximum length L2 in the z direction, e.g., as measured between opposite edges along a straight line in the z direction, and the second maximum length L2 may be greater than the first maximum length L1 of the first dielectric layer 142. The second maximum length L2 may be greater than the third maximum length L3 of the gate layer 130. The electric charge storage layer 144 may be configured as an electric charge trapping layer or a floating gate conductive layer. When the electric charge storage layer 144 is an electric charge trapping layer, the electric charge storage layer 144 may be formed of silicon nitride. The electric charge storage layer 144 may include first and second layers 144A and 144B sequentially disposed on the first dielectric layer 142. The first and second layers 144A and 144B may include the same composition and/or properties or different composition and/or properties. For example, the first layer 144A may have a composition of $Si_3N_4$, and the second layer 144B may have a composition which is Si-richer or N-richer than $Si_3N_4$. However, in example embodiments, an interface between the first and second layers 144A and 144B included in the electric charge storage layers 144 may not be clearly distinct in an electron microscope or the like.

The second dielectric layer 146 may be disposed between the electric charge storage layers 144 and the channel layer 140 on the electric charge storage layers 144. The second dielectric layer 146 may be connected between the gate layers 130 vertically adjacent to each other and may be disposed as a single layer in a single channel structure CH. The second dielectric layer 146 may cover the interlayer insulating layers 120, the first dielectric layers 142, and the electric charge storage layers 144, and may be disposed between the electric charge storage layers 144 and the channel layer 140. For example, the second dielectric layer 146 may be in contact with at least a portion of upper surfaces and lower surfaces of the first dielectric layers 142 in an upper portion and a lower portion of each of the first dielectric layers 142. The second dielectric layer 146 may be in contact with side surfaces of the interlayer insulating layers 120 between the gate layers 130. In the second dielectric layer 146, a side surface in contact with the channel layer 140 may have a rounded shape curved towards the channel layer 140. For example, the second dielectric layer 146 may extend continuously along an entire depth of each channel structure CH to conformally cover surfaces of the interlayer insulating layers 120 and electric charge storage layers 144 facing the channel structure CH.

The second dielectric layer 146 may tunnel an electric charge to the electric charge storage layers 144. For example, the second dielectric layer 146 may include silicon oxide ($SiO_2$), silicon nitride ($Si_3N_4$), silicon oxynitride (SiON), or combinations thereof.

The channel pad 155 may cover an upper surface of the channel insulating layer 150 and may be electrically connected to the channel layer 140. The channel pad 155 may include, e.g., doped polycrystalline silicon.

Accordingly, in the channel structures CH, the electric charge storage layers 144 may be separated from each other between the gate layers 130 vertically adjacent to each other, such that degradation of electrical properties, e.g., degradation of retention properties caused by charge spreading, may be prevented. Also, by forming the electric charge storage layers 144 using an optimized manufacturing process, the first dielectric layers 142 and the second dielectric layer 146 may be configured to surround the electric charge storage layers 144.

The separation regions SR may penetrate the gate layers 130 and the interlayer insulating layers 120 between the channel layers 140 and may extend in the y direction, and may be connected to the substrate 101. The separation insulating layers 110 may be disposed in the separation regions SR. The separation regions SR may have a shape in which a width of each of the separation regions SR may decrease towards the substrate 101 due to a relatively high aspect ratio, but an example embodiment thereof is not limited thereto. Each of the separation regions SR may have a side surface perpendicular to an upper surface of the substrate 101. The separation insulating layers 110 may include an insulating material, e.g., silicon oxide, silicon nitride, or silicon oxynitride. In example embodiments, the separation regions SR may further include a conductive layer disposed in the separation insulating layer 110, and the conductive layer may be electrically connected to the first and second horizontal conductive layers 104 and 105 and/or the substrate 101.

The cell region insulating layer 190 may be disposed on the stack structure GS of the gate layers 130, and may include an insulating material, e.g., silicon oxide, silicon nitride, or the like.

Figure 4A:
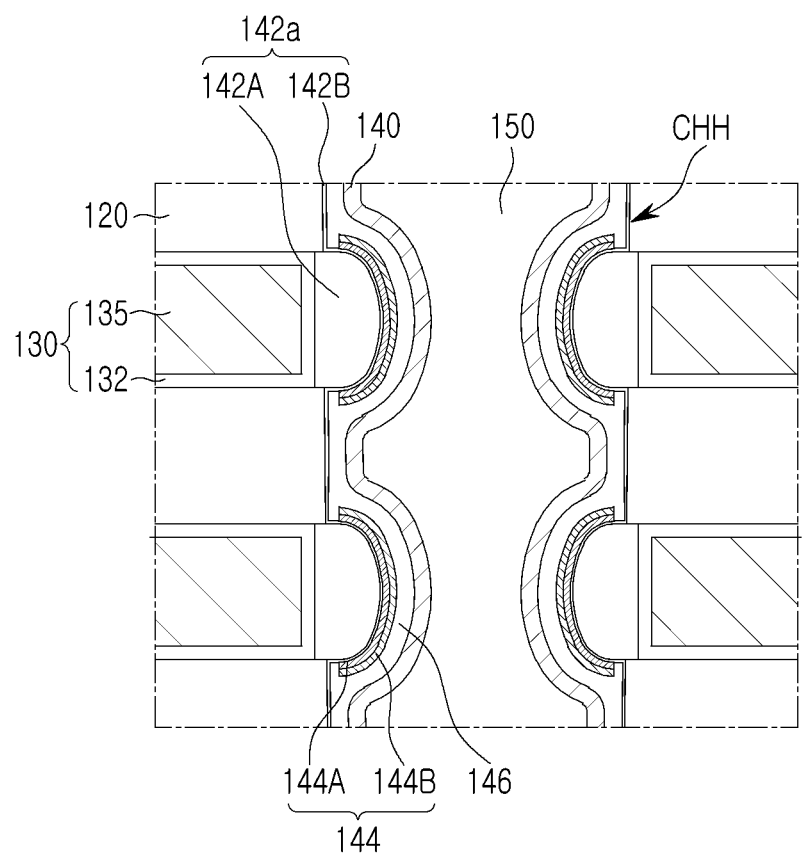
FIGS. 4A to 4C are schematic enlarged views illustrating a portion of a semiconductor device according to an example embodiment.
Figure 4B:
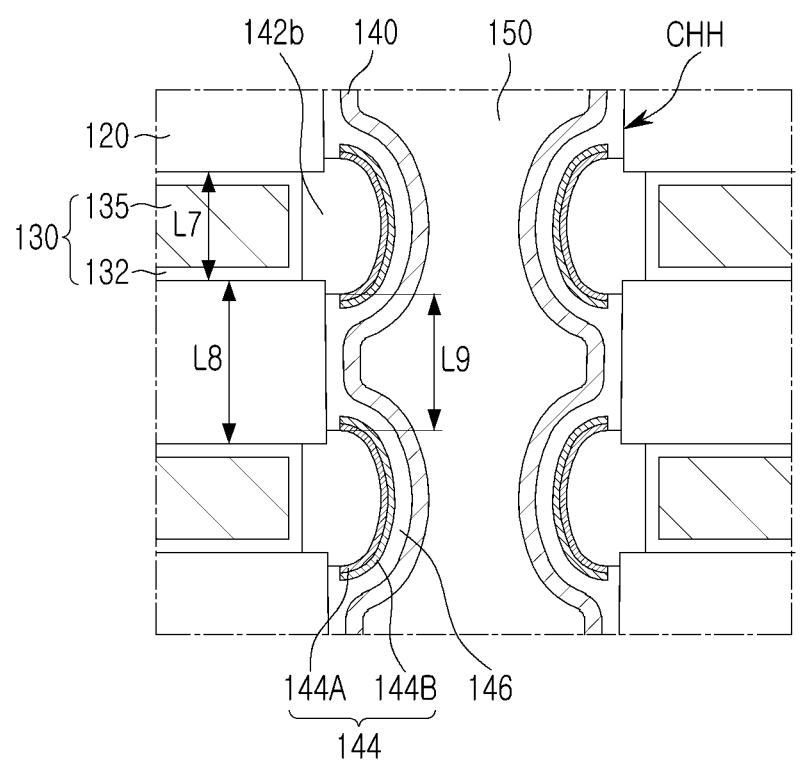
Figure 4C:
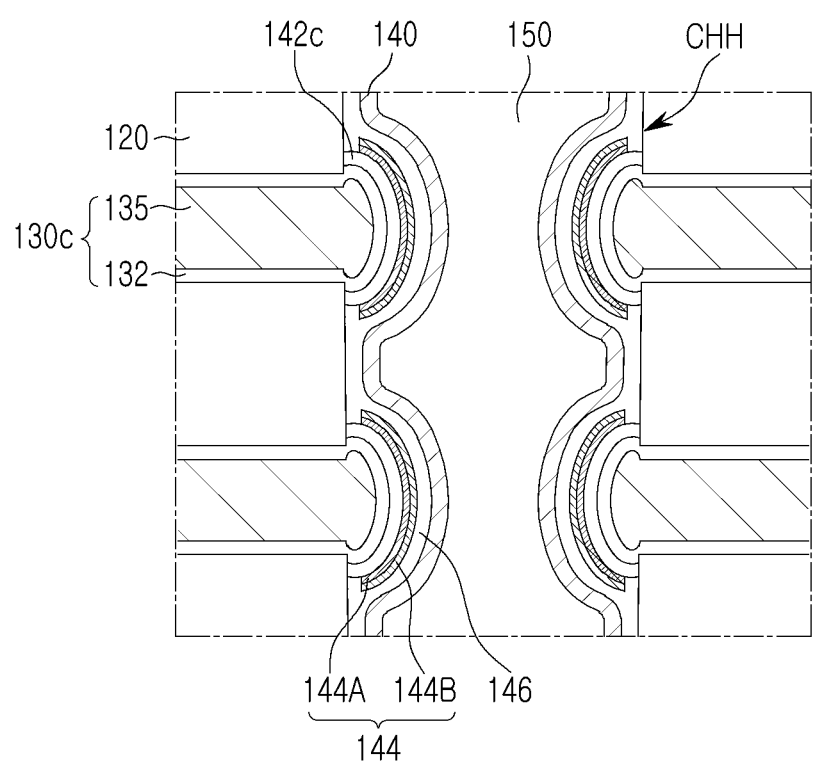

FIGS. 4A to 4C are schematic enlarged views illustrating a portion of a semiconductor device corresponding to region "A" in FIG. 2.

Referring to FIG. 4A, in a semiconductor device 100a, first dielectric layers 142a may include first layers 142A on side surfaces of gate layers 130 and a second layer 142B on each of side surfaces of the first layers 142A. The first layers 142A may only be disposed on the side surfaces of the gate layers 130, similarly to the first dielectric layer 142 described with reference to FIGS. 1 to 3B. The second layer 142B may be disposed as a single, e.g., continuous, layer on each of the side surfaces of the first layers 142A and the side surfaces of the interlayer insulating layers 120. The second layer 142B may have a thickness less than a thickness of each of the first layers 142A in the x direction, but an example embodiment thereof is not limited thereto. As first dielectric layers 142a further include the second layer 142B, a possibility of damage to electric charge storage layers 144 and a second dielectric layer 146 may be reduced in a process of removing sacrificial layers 180 described with reference to FIG. 12I below.

Referring to FIG. 4B, in a semiconductor device 100b, a length of each of first dielectric layers 142b which overlap interlayer insulating layers 120 in the z direction, i.e., a length of a region in the x direction extended between the interlayer insulating layers 120, may be relatively long, differently from the example embodiment illustrated in FIGS. 3A and 3B. Also, each of the first dielectric layers 142b may have a length expanding upwardly downwardly in the z direction in a region protruding into a channel hole CHH. Accordingly, the first dielectric layers 142b may be partially in contact with the interlayer insulating layers 120.

For example, the gate layers 130 may have a seventh length L7 shorter than the third length L3 illustrated in FIG. 3A, and accordingly, each of the interlayer insulating layers 120 may have an eighth length L8 longer than the fourth length L4. In this case, for example, a minimum length between the first dielectric layers 142b vertically adjacent to each other may be a ninth length L9, and the ninth length L9 may be substantially the same as the fourth length L4 illustrated in FIG. 3A. In the semiconductor device 100b, each of the interlayer insulating layers 120 may have an increased thickness such that stability of the stack structure GS may improve in a manufacturing process, and a shape of each of the first dielectric layers 142b may be adjusted such that a distance between the first dielectric layers 142b may be maintained, thereby securing electrical properties of the semiconductor device 100b.

Referring to FIG. 4C, in a semiconductor device 100c, a portion of gate layers 130c may protrude into a channel hole CHH, and accordingly, first dielectric layers 142c may be configured to surround ends of the gate layers 130c. In example embodiments, a degree of rounding the ends of the gate layers 130c may be varied.

Figure 5A:
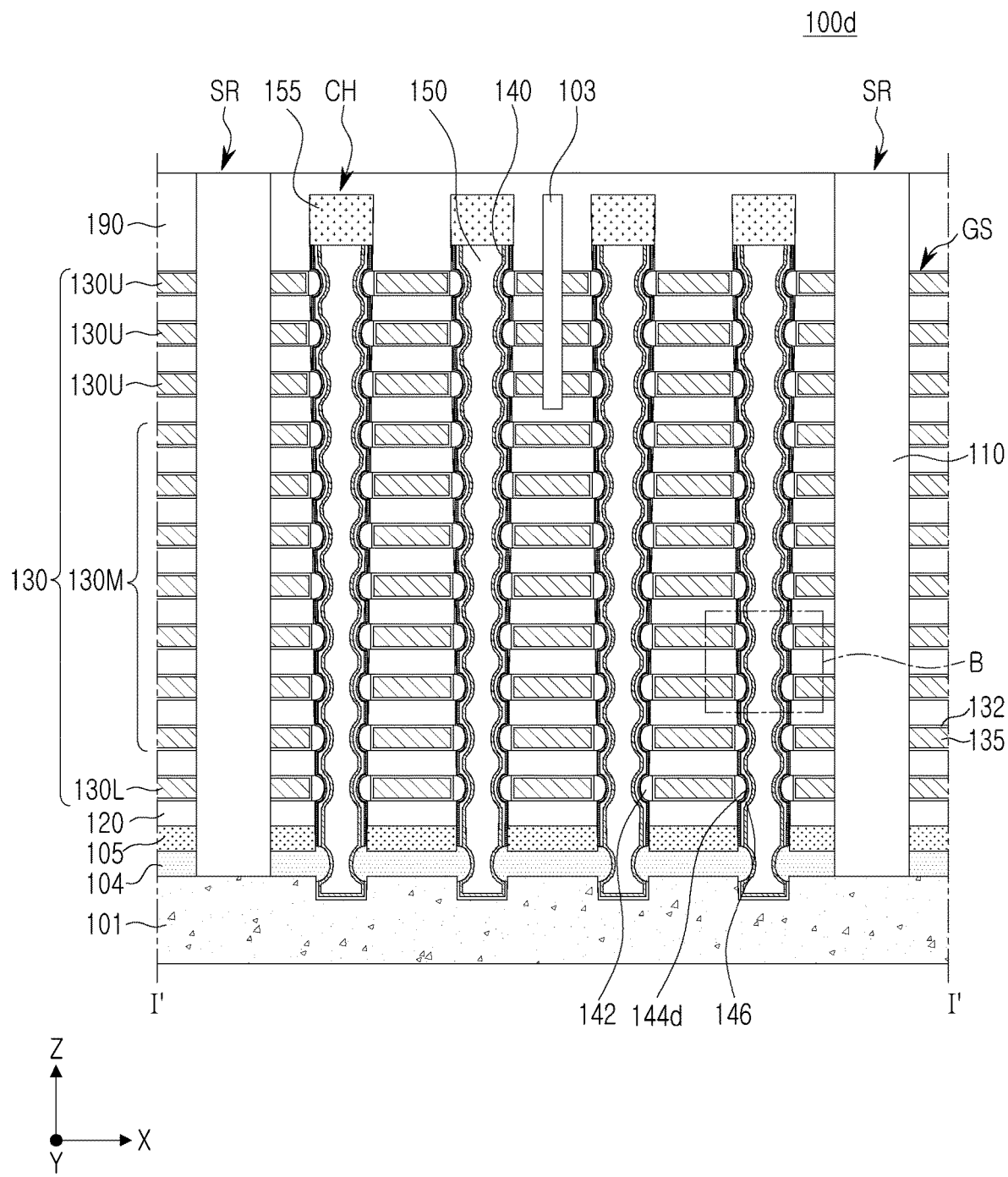
FIGS. 5A and 5B are a schematic cross-sectional view illustrating a semiconductor device and an schematic enlarged view illustrating a portion of a semiconductor device according to an example embodiment.
Figure 5B:
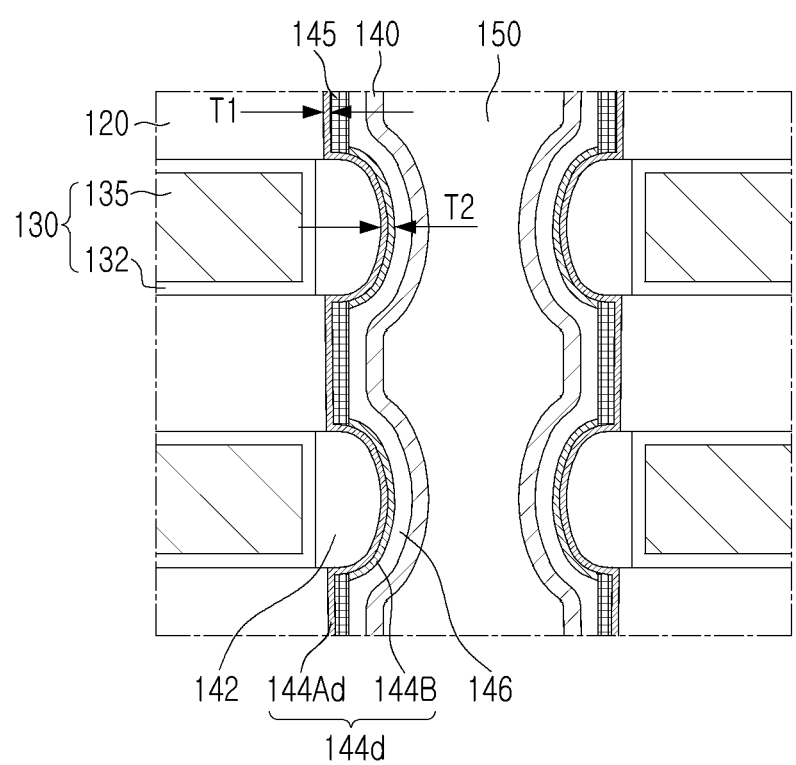

FIGS. 5A and 5B are a schematic cross-sectional view illustrating a semiconductor device and a schematic enlarged view of region "B" in FIG. 5A, respectively.

Referring to FIGS. 5A and 5B, in the channel structure CH of a semiconductor device 100d, a first layer 144Ad of each of electric charge storage layers 144b may be connected between gate layers 130 vertically adjacent to each other and may be disposed as a single layer in a single channel structure CH. Accordingly, the first layer 144Ad may extend to side surfaces of the interlayer insulating layers 120 and may be in contact with the interlayer insulating layers 120. Second layers 144B may be disposed on a portion of a side surface of the first layer 144Ad to be separated from each other between the gate layers 130 vertically adjacent to each other. Accordingly, first dielectric layers 142 may be surrounded by the gate layers 130, the interlayer insulating layers 120, and the first layer 144Ad.

A thickness of the first layer 144Ad in the x direction may be less than or substantially the same as a thickness of the second layer 142B. In example embodiments, an interface between the first layer 144Ad and the second layer 142B may not be distinct in an electron microscope, but, even in this case, a thickness T1 of each of electric charge storage layers 144d on side surfaces of the interlayer insulating layers 120 may be less than a thickness T2 of each of the electric charge storage layers 144d on the side surfaces of the first dielectric layers 142.

The channel structure CH may further include intermediate insulating layers 145 interposed between the first layer 144Ad and the second dielectric layer 146 on the side surfaces of the interlayer insulating layers 120. The intermediate insulating layers 145 may be in contact with the first layer 144Ad and the second dielectric layer 146 and also in contact with ends of the second layers 144B. Accordingly, each second layer 144B may be surrounded by the first layer 144Ad, intermediate insulating layers 145, and the second dielectric layer 146. The intermediate insulating layer 145 may include a material different from a material of the first layer 144Ad, and may include an insulating layer, e.g., silicon oxide, silicon nitride, or silicon oxynitride. For example, the intermediate insulating layer 145 may include a same material as a material of the first dielectric layers 142, but an example embodiment thereof is not limited thereto.

Figure 6A:
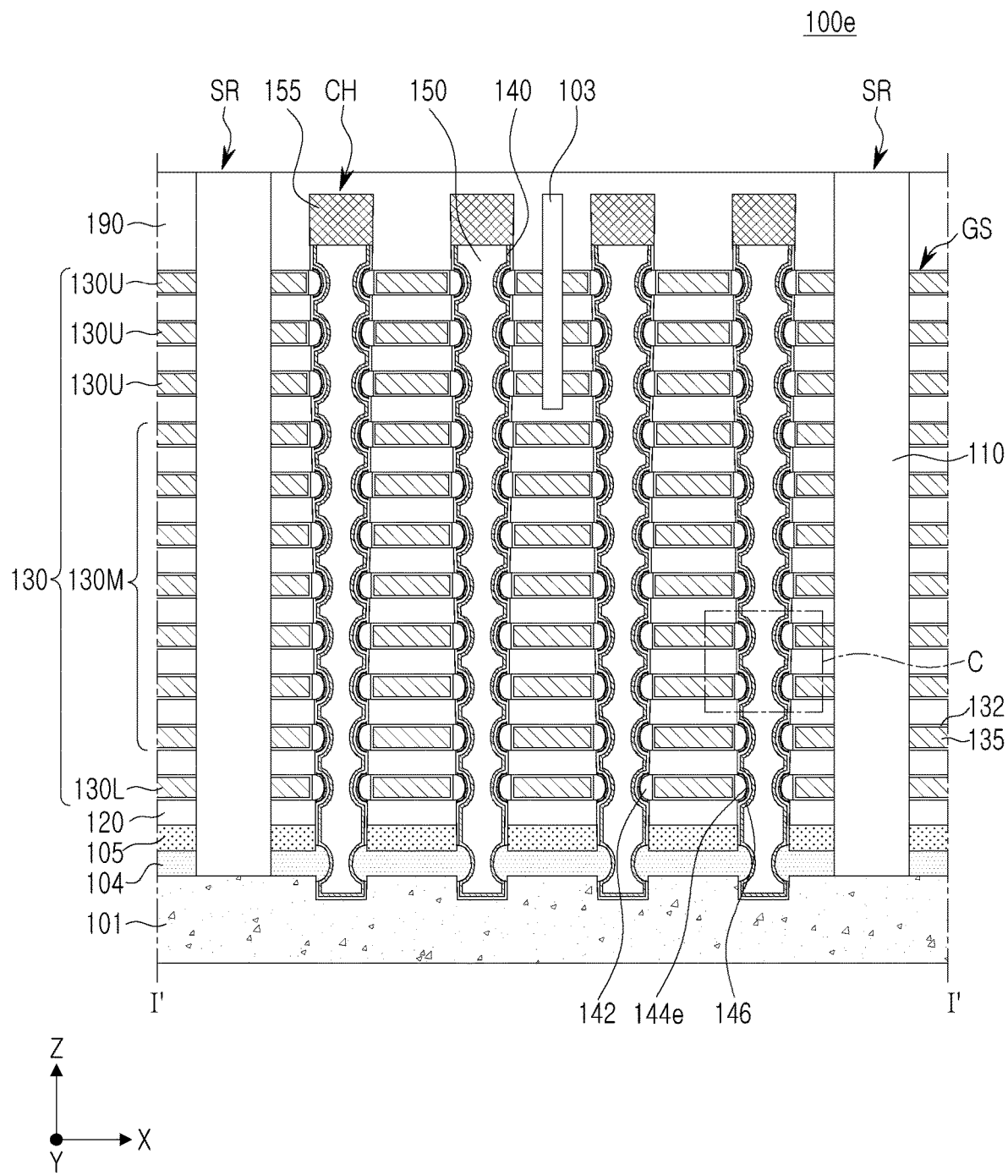
FIGS. 6A and 6B are a schematic cross-sectional view illustrating a semiconductor device and an schematic enlarged view illustrating a portion of a semiconductor device according to an example embodiment.
Figure 6B:
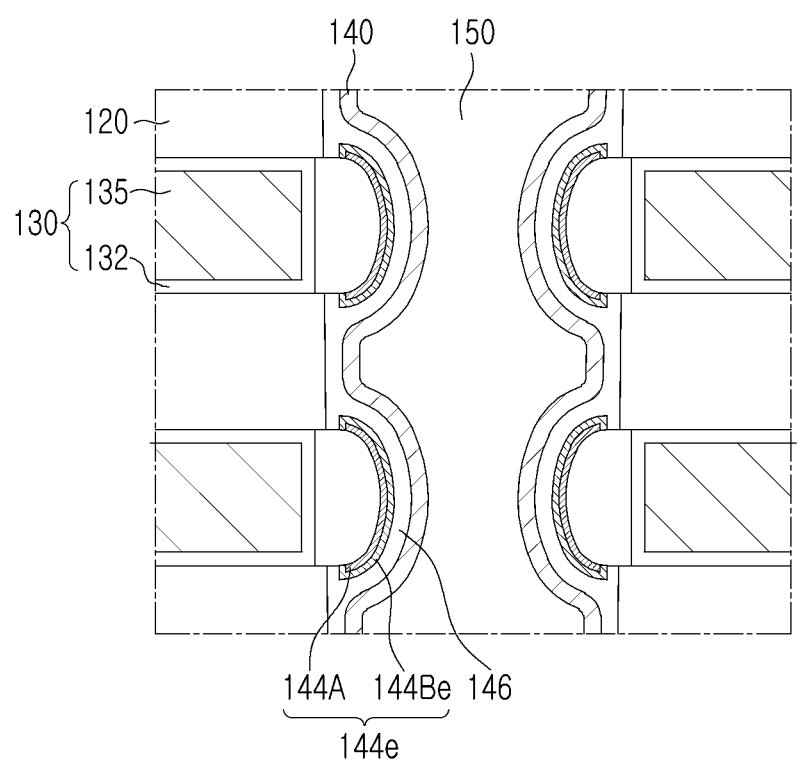

FIGS. 6A and 6B are a schematic cross-sectional view illustrating a semiconductor device and an enlarged view of region "C" in FIG. 6A.

Referring to FIGS. 6A and 6B, in the channel structure CH of a semiconductor device 100e, second layers 144Be of an electric charge storage layer 144e may be configured to enclose ends of first layers 144A, respectively. Accordingly, the first layers 144A may be surrounded by the first dielectric layer 142 and the second layer 144Be, and the second layer 144Be may be in contact with the first layer 144A, the first dielectric layer 142, and the second dielectric layer 146.

Figure 7A:
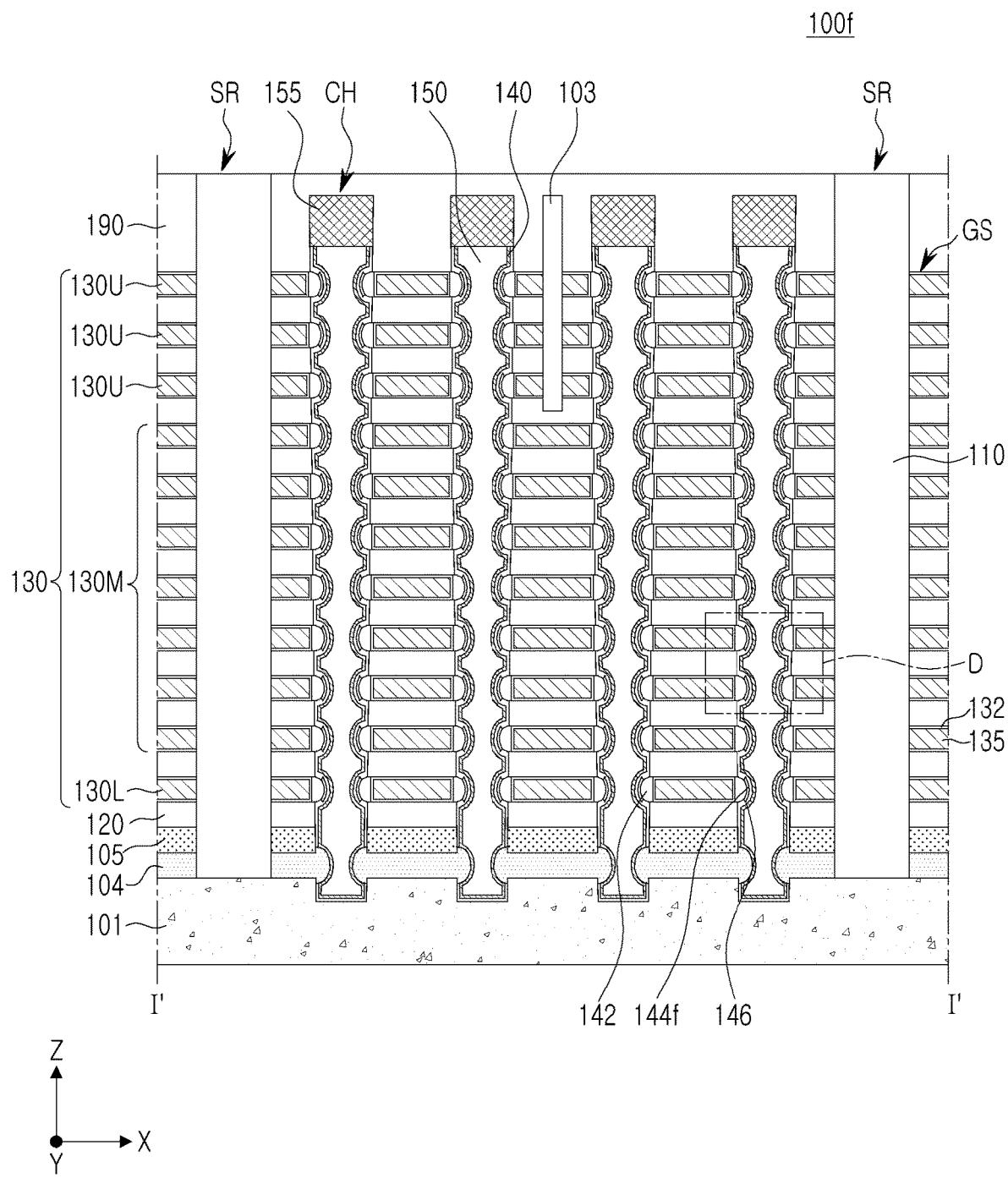
FIGS. 7A and 7B are a schematic cross-sectional view illustrating a semiconductor device and a schematic enlarged view illustrating a portion of a semiconductor device according to an example embodiment.
Figure 7B:
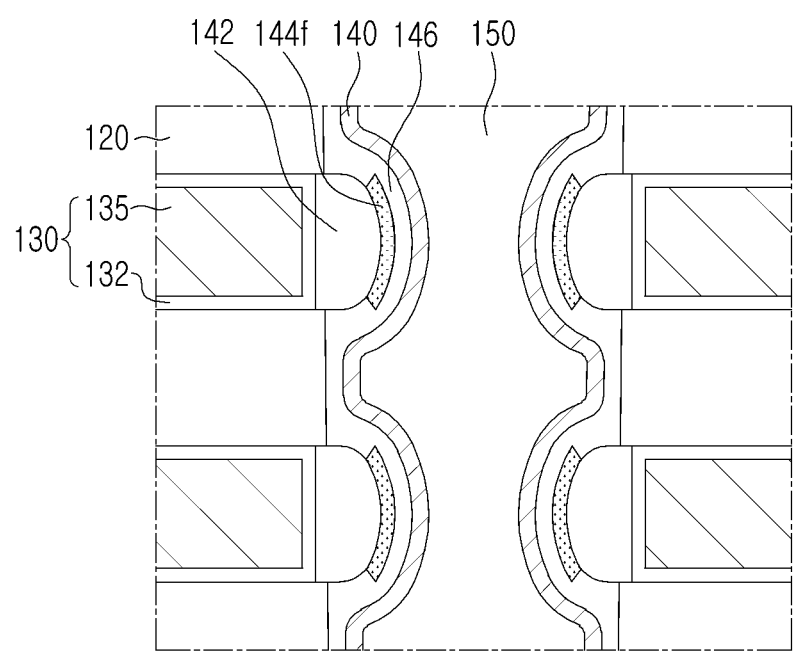

FIGS. 7A and 7B are a schematic cross-sectional view illustrating a semiconductor device and an enlarged view of region "D" in FIG. 7A.

Referring to FIGS. 7A and 7B, in the channel structure CH of a semiconductor device 100f, electric charge storage layers 144f may be disposed on side surfaces of the first dielectric layers 142, respectively. Also, each of side surfaces of the electric charge storage layers 144f in contact with the second dielectric layer 146 may have a relatively planar shape, and the side surface in contact with the second dielectric layer 146 may have an area greater than an area of each of side surfaces in contact with the first dielectric layers 142. Accordingly, the electric charge storage layers 144f may have inclined upper and lower surfaces, and shapes of the inclined upper and lower surfaces may be varied in example embodiments.

Figure 8A:
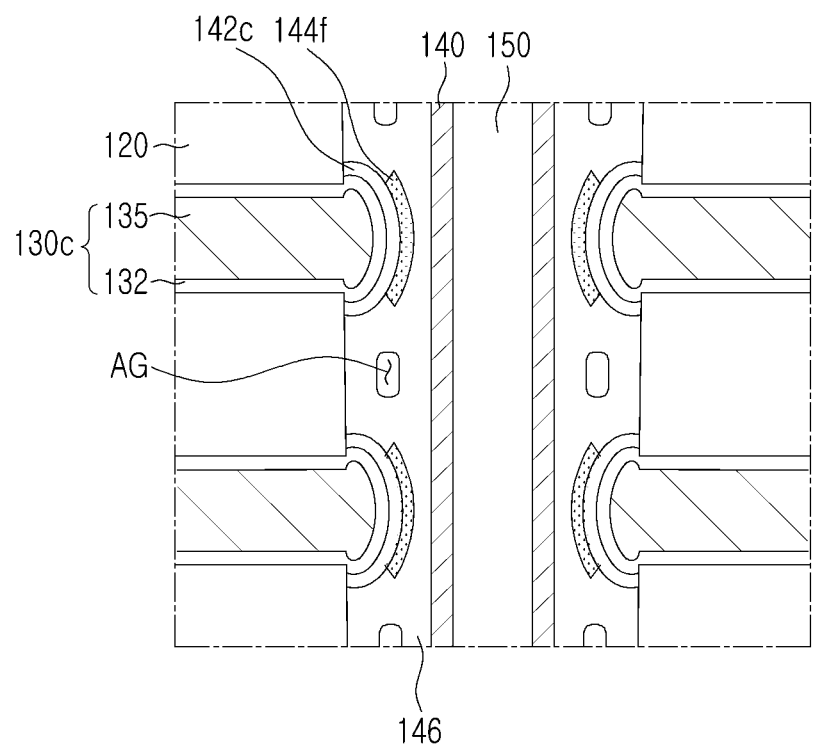
FIGS. 8A and 8B are schematic enlarged views illustrating a portion of a semiconductor device according to an example embodiment.
Figure 8B:
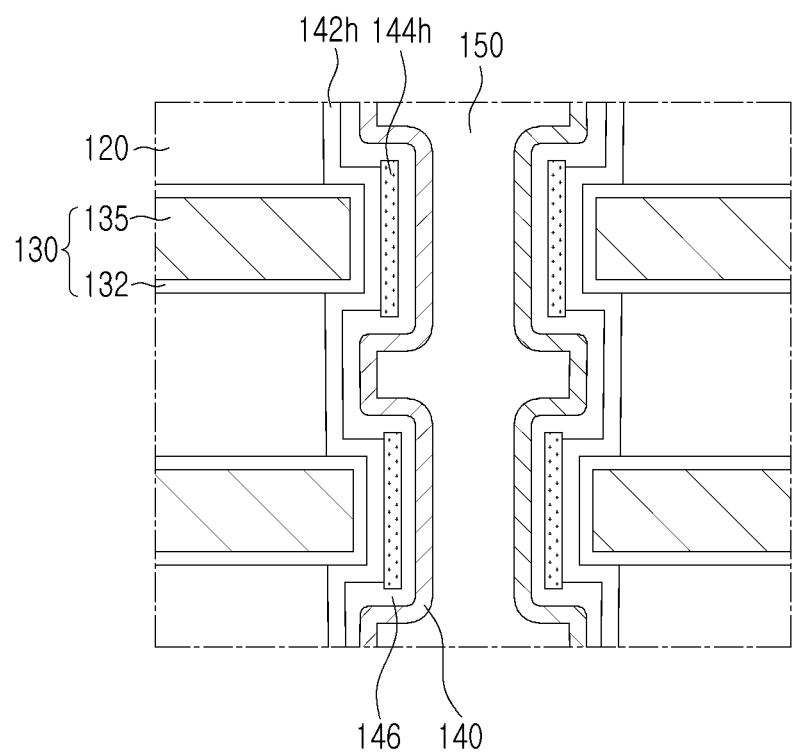

FIGS. 8A and 8B are schematic enlarged views of semiconductor devices corresponding to region "D" in FIG. 7A.

Referring to FIG. 8A, in the channel structure CH of a semiconductor device 100g, each of the electric charge storage layers 144f may have the same shape as in the example embodiment illustrated in FIG. 7A and 7B, and a portion of gate layers 130c may be configured to protrude into the channel hole CHH and to extend in the channel hole CHH as in FIG. 4C. Accordingly, first dielectric layers 142c may be configured to surround portions of ends of the gate layers 130c as in FIG. 4C.

Also, the channel structure CH may have air gaps AG formed in the second dielectric layer 146. When a thickness of each of the first dielectric layers 142c and the electric charge storage layers 144f in the x direction is relatively great or a thickness of each of interlayer insulating layers 120 in the z direction is relatively small, the air gaps AG may be formed in the second dielectric layer 146 when the second dielectric layer 146 is formed. A shape and a dispositional region of each of the air gaps AG may not be limited to the examples illustrated in the figure, and the air gaps AG may also be applied to other example embodiments depending on a relationship between the thicknesses.

Referring to FIG. 8B, in het channel structure CH of a semiconductor device 100h, a portion of the gate layers 130 may be configured to protrude into the channel hole CHH. Accordingly, a distance between side surfaces of the interlayer insulating layers 120 and a central axis of the channel hole CHH may be greater than a distance between side surfaces of the gate layers 130 and the central axis of the channel hole CHH. Also, a first dielectric layer 142h may be connected between the gate layers 130 vertically adjacent to each other and may be disposed as a single layer in a single channel structure CH.

Electric charge storage layers 144h may be disposed on a side surface of the first dielectric layer 142h in a region in which the first dielectric layer 142h protrudes toward the central axis of the channel hole CHH. Accordingly, the electric charge storage layers 144h may be disposed on each of side surfaces of the gate layer 130, and may have a length greater than a length of the gate layer 130 taken in the z direction. The second dielectric layer 146 may cover the first dielectric layer 142h and the electric charge storage layers 144h. The second dielectric layer 146 may have a curved portion corresponding to the electric charge storage layers 144h, but an example embodiment thereof is not limited thereto. The second dielectric layer 146 may extend substantially perpendicularly to an upper surface of the substrate 101 in a planar manner in accordance with a length of the protrusion of each of the gate layers 130 and a thickness of each of the electric charge storage layers 144h.

Figure 9:
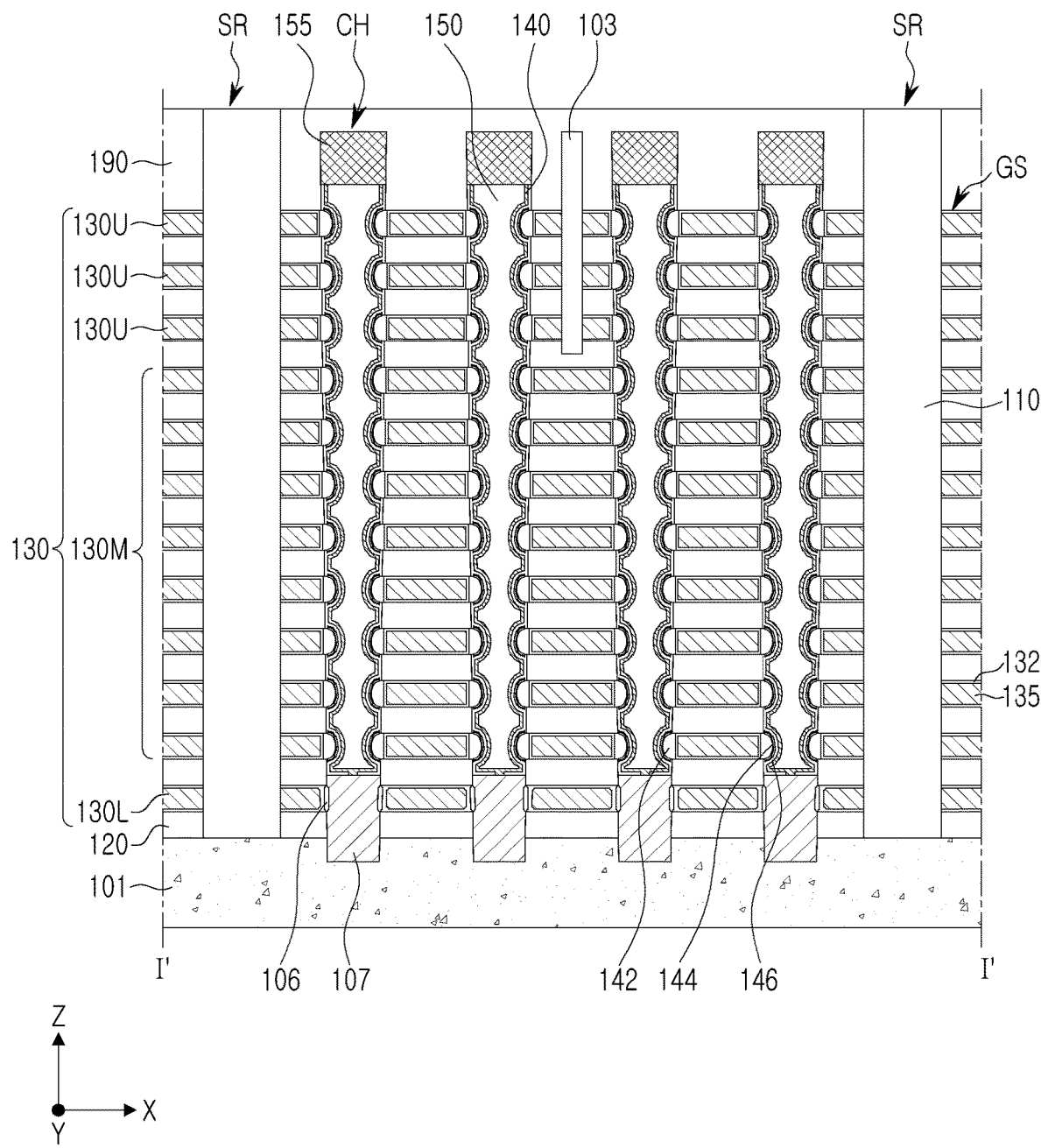
FIG. 9 is a schematic cross-sectional view illustrating a semiconductor device according to an example embodiment.

FIG. 9 is a schematic cross-sectional view illustrating a semiconductor device according to an example embodiment.

Referring to FIG. 9, a semiconductor device 100i may not include the first and second horizontal conductive layers 104 and 105, differently from the semiconductor device 100 illustrated in FIG. 2, and may further include side-surface insulating layers 106 and epitaxial layers 107 disposed on lower ends of the channel structures CH.

The epitaxial layers 107 may be disposed on the substrate 101 in a lower portion of the channel structures CH, and may be disposed on side surfaces of at least one gate layer 130. The side-surface insulating layers 106 may be disposed between the epitaxial layers 107 and the gate layer 130. The epitaxial layers 107 may be disposed in a recessed region of the substrate 101. A height of each of upper surfaces of the epitaxial layers 107 may be higher than an upper surface of a lowermost lower gate layer 130L and may be lower than a lower surface of a memory gate layer 130M disposed above the epitaxial layers 107, but an example embodiment thereof is not limited thereto. A dispositional structure of the epitaxial layers 107 may also be applied to the example embodiments illustrated in FIGS. 4A to 8, 10, and 11.

Figure 10:
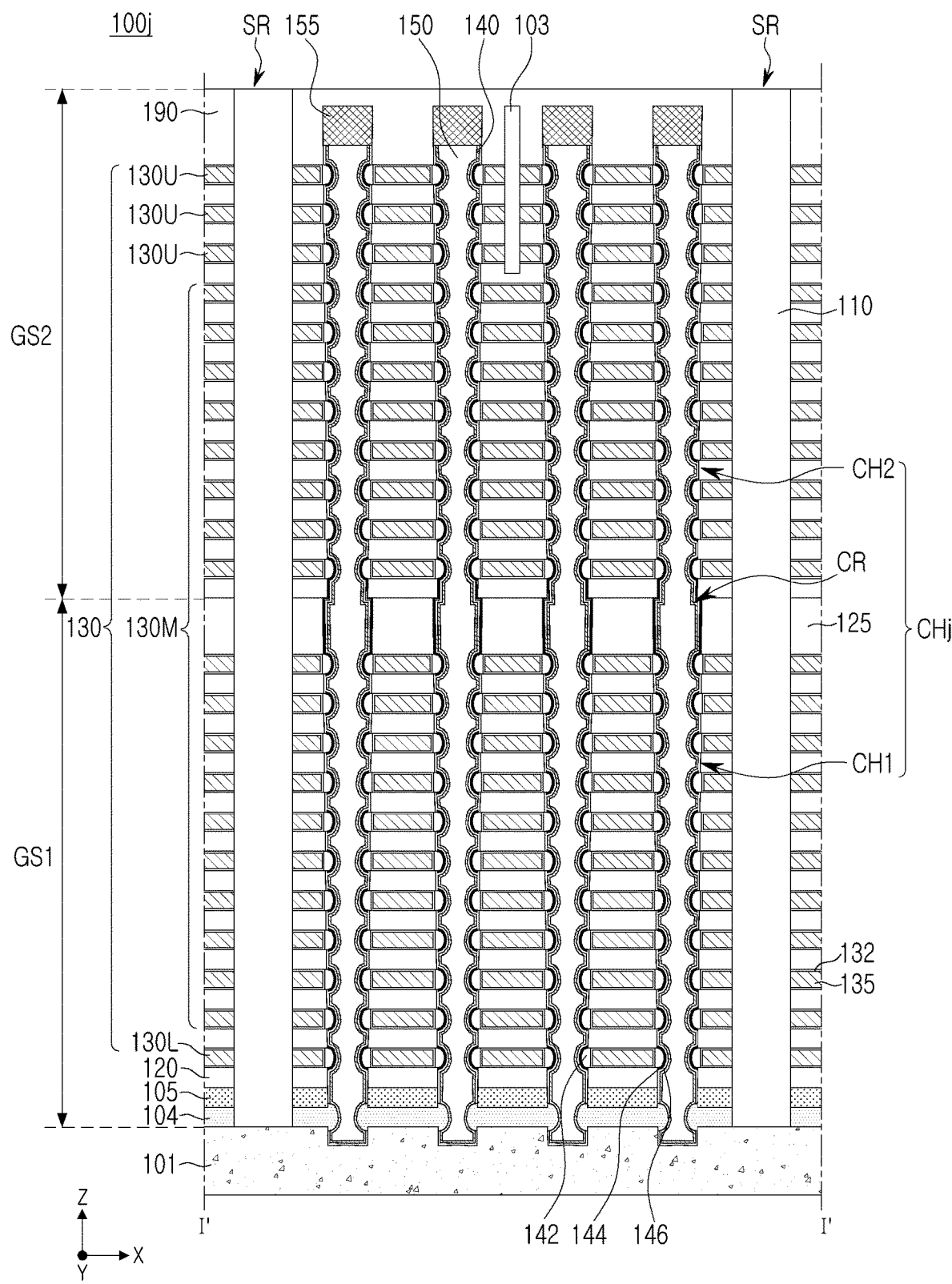
FIG. 10 is a schematic cross-sectional view illustrating a semiconductor device according to an example embodiment.

FIG. 10 is a schematic cross-sectional view illustrating a semiconductor device according to an example embodiment.

Referring to FIG. 10, a semiconductor device 100j may include first and second stack structures GS1 and GS2 in each of which stack structures of the gate layers 130 are vertically stacked, and channel structures CHj in which first and second channel structures CH1 and CH2 are vertically stacked. The structure of the channel structures CHj may be introduced to stably form the channel structures CHj when a relatively great number of the stacked gate layers 130 are stacked.

An upper interlayer insulating layer 125 having a relatively great thickness may be disposed on an uppermost portion of the first stack structure GS1. In the channel structures CHj, the first channel structures CH1 of the first stack structure GS1 are connected to the second channel structures CH2 of the second stack structure GS2, and each of the channel structures CHj may have a curved portion due to a difference in width in a connection region CR.

In the connection region CR, an electric charge storage layer 144 may be configured to be connected between the gate layers 130 vertically adjacent to each other. This structure may be formed because the intermediate insulating layer 145 does not remain in the connection region CR but is removed in a process described with reference to FIG. 12F as the upper interlayer insulating layer 125 having a relatively great thickness is disposed. In example embodiments, the electric charge storage layers 144 may not be disposed in the connection region CR in accordance with a thickness of the upper interlayer insulating layer 125, a diameter of each of the channel structures CHj, and a thickness of each of layers disposed in the channel structures CHj.

The channel pad 155 may only be disposed on an upper end of the second channel structure CH2. In example embodiments, however, each of the first channel structures CH1 and the second channel structures CH2 may include the channel pad 155, and in this case, the channel pad 155 of the first channel structures CH1 may be connected to the channel layer 140 of the second channel structures CH2.

Figure 11:
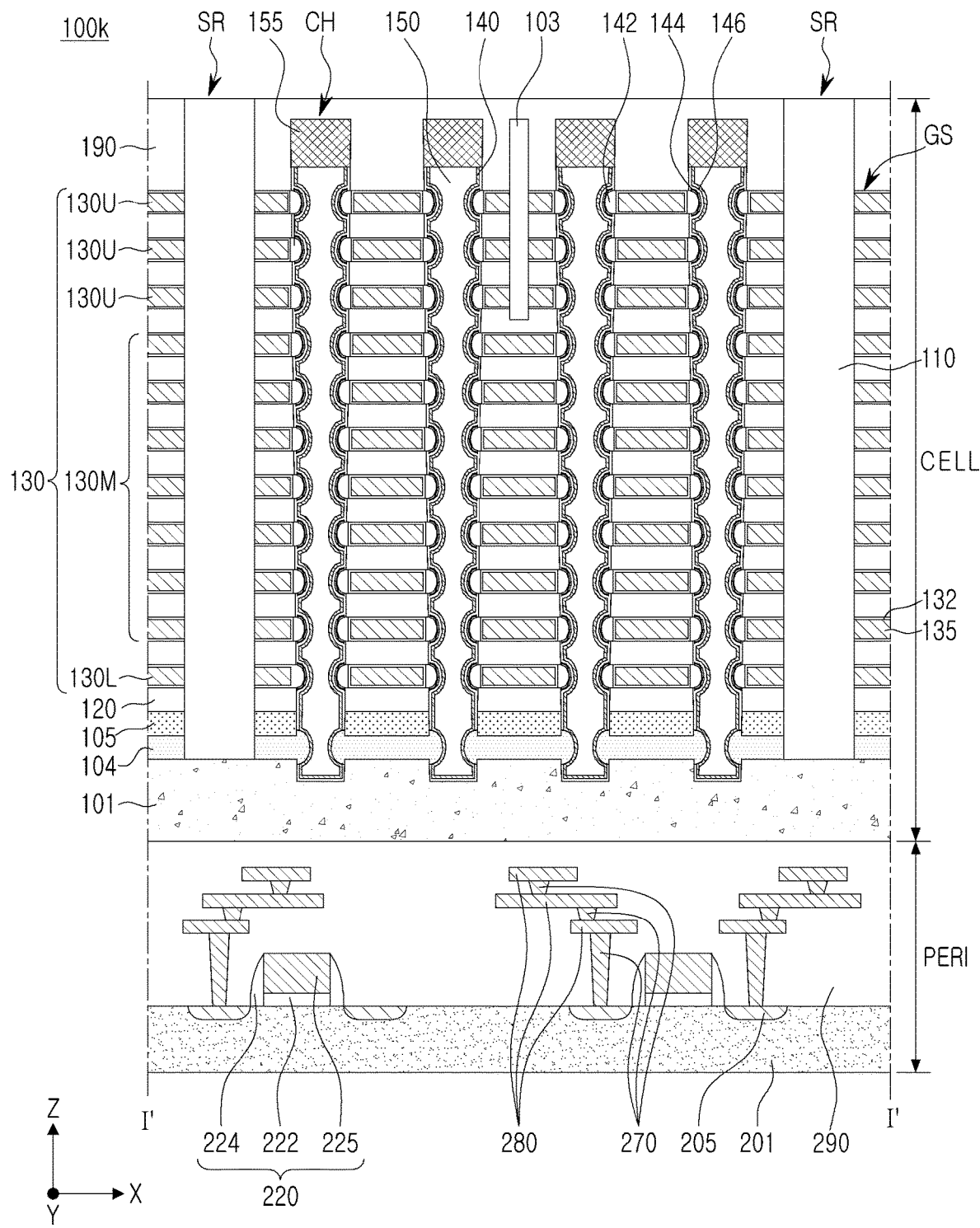
FIG. 11 is a schematic cross-sectional view illustrating a semiconductor device according to an example embodiment.

FIG. 11 is a schematic cross-sectional view illustrating a semiconductor device according to an example embodiment.

Referring to FIG. 11, a semiconductor device 100k may include a memory cell region CELL and a peripheral circuit region PERI stacked vertically. The memory cell region CELL may be disposed on an upper end of the peripheral circuit region PERI. For example, in the semiconductor device 100 illustrated in FIG. 2, the peripheral circuit region PERI may be disposed on the substrate 101 in a region not illustrated, and in the semiconductor device 100i in the example embodiment, the memory cell region CELL and the peripheral circuit region PERI may be stacked vertically. In example embodiments, the cell region CELL may be disposed on a lower end of the peripheral circuit region PERI. The description of the memory cell region CELL may be the same as in the example embodiments illustrated in FIGS. 1 to 3B.

The peripheral circuit region PERI may include a base substrate 201, circuit devices 220 disposed on the base substrate 201, circuit contact plugs 270, and circuit wiring lines 280.

The base substrate 201 may have an upper surface extending in the x direction and the y direction. In the base substrate 201, device isolation layers may be formed such that an active region may be defined. Source/drain regions 205 including impurities may be disposed in a portion of the active region. The base substrate 201 may include a semiconductor material, e.g., a group IV semiconductor, a group III-V compound semiconductor, or a group II-VI compound semiconductor.

The circuit devices 220 may include a planar transistor. Each of the circuit devices 220 may include a circuit gate dielectric layer 222, spacer layers 224, and a circuit gate electrode 225. The source/drain regions 205 may be disposed in the base substrate 201 on both sides of the circuit gate electrode 225.

A peripheral region insulating layer 290 may be disposed on the circuit device 220 on the base substrate 201. The circuit contact plugs 270 may penetrate the peripheral region insulating layer 290 and may be connected to the source/drain regions 205. An electrical signal may be applied to the circuit device 220 by the circuit contact plugs 270. In a region not illustrated, the circuit contact plugs 270 may also be connected to the circuit gate electrode 225. The circuit wiring lines 280 may be connected to the circuit contact plugs 270, and may be disposed as a plurality of layers.

In the semiconductor device 100k, the peripheral circuit region PERI may be manufactured, the substrate 101 of the memory cell region CELL may be disposed in an upper portion of the peripheral circuit region PERI, and the memory cell region CELL may be manufactured. The substrate 101 may have a same size as a size of the base substrate 201, or may have a size smaller than a size of the base substrate 201. The memory cell region CELL may be connected to the peripheral circuit region PERI in a region not illustrated. For example, an end of the gate layer 130 in the y direction may be electrically connected to the circuit devices 220. The example embodiment in which the memory cell region CELL and the peripheral circuit region PERI are vertically stacked may also be applied to the example embodiments illustrated in FIGS. 1 to 10.

FIGS. 12A to 12I are schematic cross-sectional views illustrating stages in a method of manufacturing the semiconductor device in FIGS. 2 to 3A. The views in FIGS. 12A to 12I correspond to the cross-sectional view in FIG. 2.

Figure 12A:
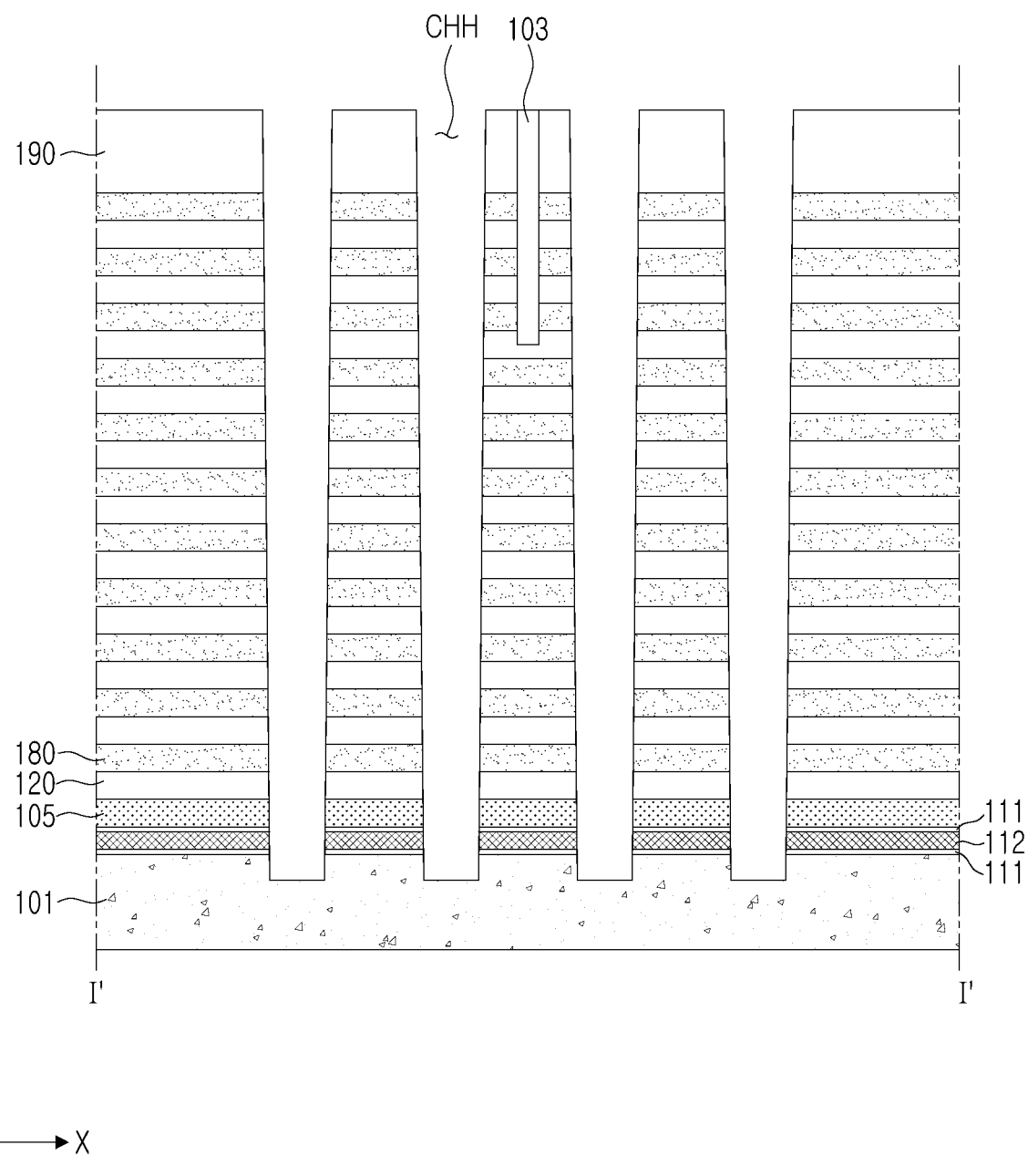
FIGS. 12A to 12I are schematic cross-sectional views illustrating stages in a method of manufacturing a semiconductor device according to an example embodiment.

Referring to FIG. 12A, first and second horizontal sacrificial layers 111 and 112 and the second horizontal conductive layer 105 may be disposed on the substrate 101, followed by forming a stack structure by alternately stacking sacrificial layers 180 and the interlayer insulating layers 120. The channel holes CHH may be formed to penetrate the stack structure.

The first and second horizontal sacrificial layers 111 and 112 may include different materials, and may be stacked on the substrate 101 such that the first horizontal sacrificial layers 111 may be disposed upwardly and downwardly of the second horizontal sacrificial layer 112. The first and second horizontal sacrificial layers 111 and 112 may be replaced with the first horizontal conductive layer 104 through a subsequent process. For example, the first horizontal sacrificial layers 111 may be formed of a same material as a material of the interlayer insulating layers 120, and the second horizontal sacrificial layer 112 may be formed of a same material as a material of the sacrificial layers 180. The second horizontal conductive layer 105 may be stacked on the first and second horizontal sacrificial layers 111 and 112.

The sacrificial layers 180 and the interlayer insulating layers 120 may be alternately stacked on the second horizontal conductive layer 105. The sacrificial layers 180 may be replaced with the gate layers 130 through a subsequent process. The sacrificial layers 180 may be formed of a material different from a material of the interlayer insulating layers 120. For example, the interlayer insulating layers 120 may be formed of at least one of silicon oxide or silicon nitride, and the sacrificial layers 180 may be formed of a material different from a material of the interlayer insulating layers 120, e.g., at least one silicon, silicon oxide, silicon carbide, and silicon nitride. In example embodiments, thicknesses of the interlayer insulating layers 120 may not be the same. For example, a lowermost interlayer insulating layer 120 may have a relatively thin thickness, and an uppermost insulating layer 120 may have a relatively great thickness. Thicknesses of the interlayer insulating layers 120 and the sacrificial layers 180 and the number of the interlayer insulating layers 120 and the sacrificial layers 180 may be varied in example embodiments illustrated in the figure. The cell region insulating layer 190 may be disposed on an uppermost portion.

The channel holes CHH may be formed by anisotropically etching the sacrificial layers 180 and the interlayer insulating layers 120, and may be formed as holes. Due to a height of the stack structure, side walls of the channel holes CHH may not be perpendicular to an upper surface of the substrate 101. The channel holes CHH may be configured to be recessed into the substrate 101.

Figure 12B:
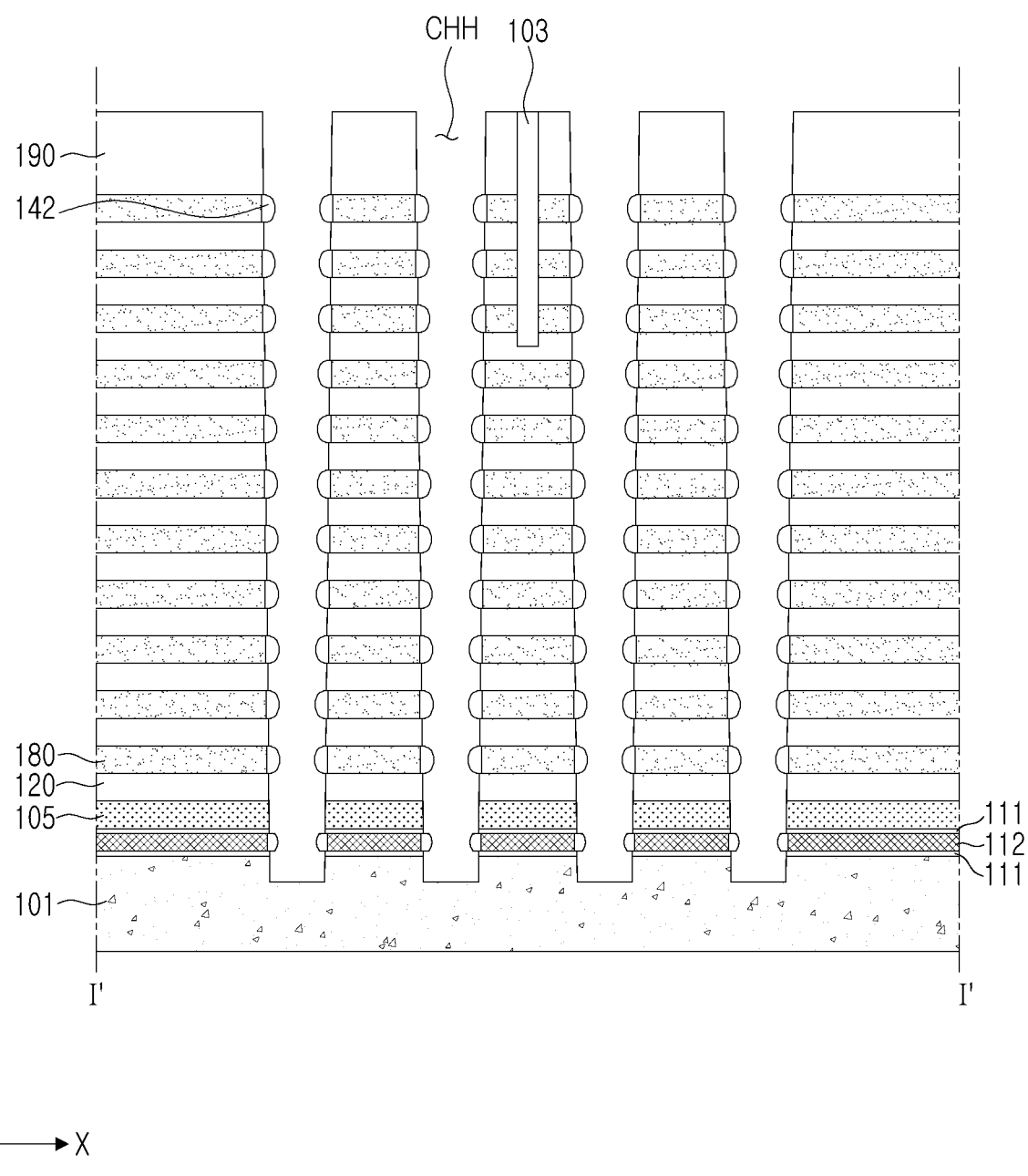

Referring to FIG. 12B, the first dielectric layers 142 may be formed by oxidizing the sacrificial layers 180 exposed through the channel holes CHH.

The sacrificial layers 180 may be oxidized from a region exposed through the channel holes CHH by a predetermined thickness, and may form the first dielectric layers 142. A portion of the first dielectric layers 142 may protrude into the channel holes CHH, e.g., along the x direction, and another portion of the first dielectric layers 142 may consume the sacrificial layers 180 and may overlap the interlayer insulating layers 120. In the first dielectric layers 142, a shape of side surfaces in contact with the sacrificial layers 180 are shown to be planar, but an example embodiment thereof is not limited thereto. Depending on process conditions of the oxidization process, the side surfaces may be formed to have a curved shape, curved toward a central axis of the channel holes CHH, or may have a concaved shape. Also, in this process, the second horizontal sacrificial layer 112 disposed in a lower portion may be partially oxidized together such that the first dielectric layer 142 may be disposed on a side surface of the second horizontal sacrificial layer 112.

The semiconductor device 100a in the example embodiment illustrated in FIG. 4A may be manufactured by further disposing second layers 142B on first layers 142A corresponding to the first dielectric layers 142 in this process.

Figure 12C:
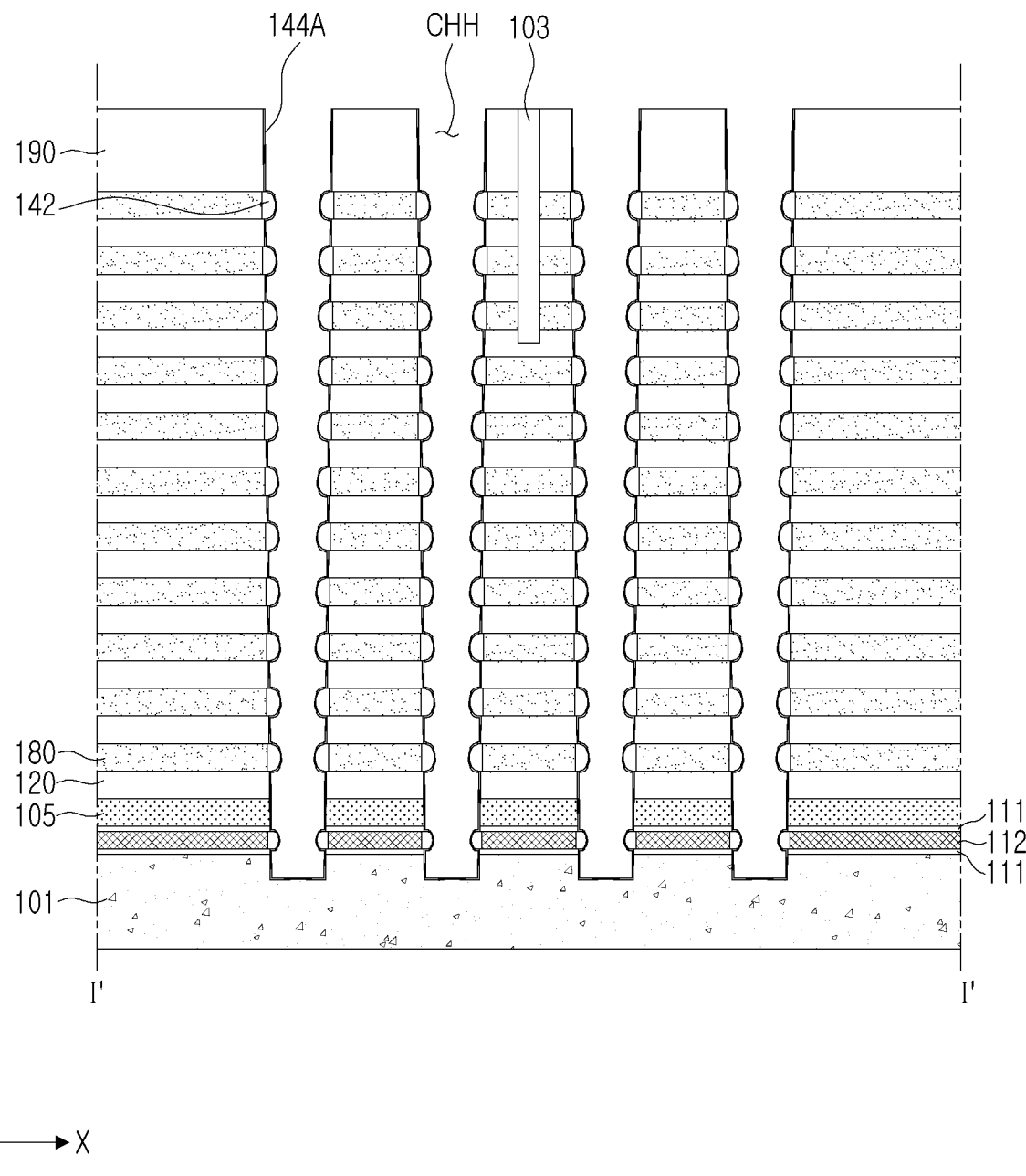

Referring to FIG. 12C, the first layer 144A may be formed on an internal side wall of each of the channel holes CHH. The first layer 144A may extend along side surfaces of the interlayer insulating layers 120 exposed through the channel holes CHH and side surfaces of the first dielectric layers 142. The first layer 144A may be configured to have a uniform thickness through an atomic layer deposition (ALD) or a chemical vapor deposition (CVD).

Figure 12D:
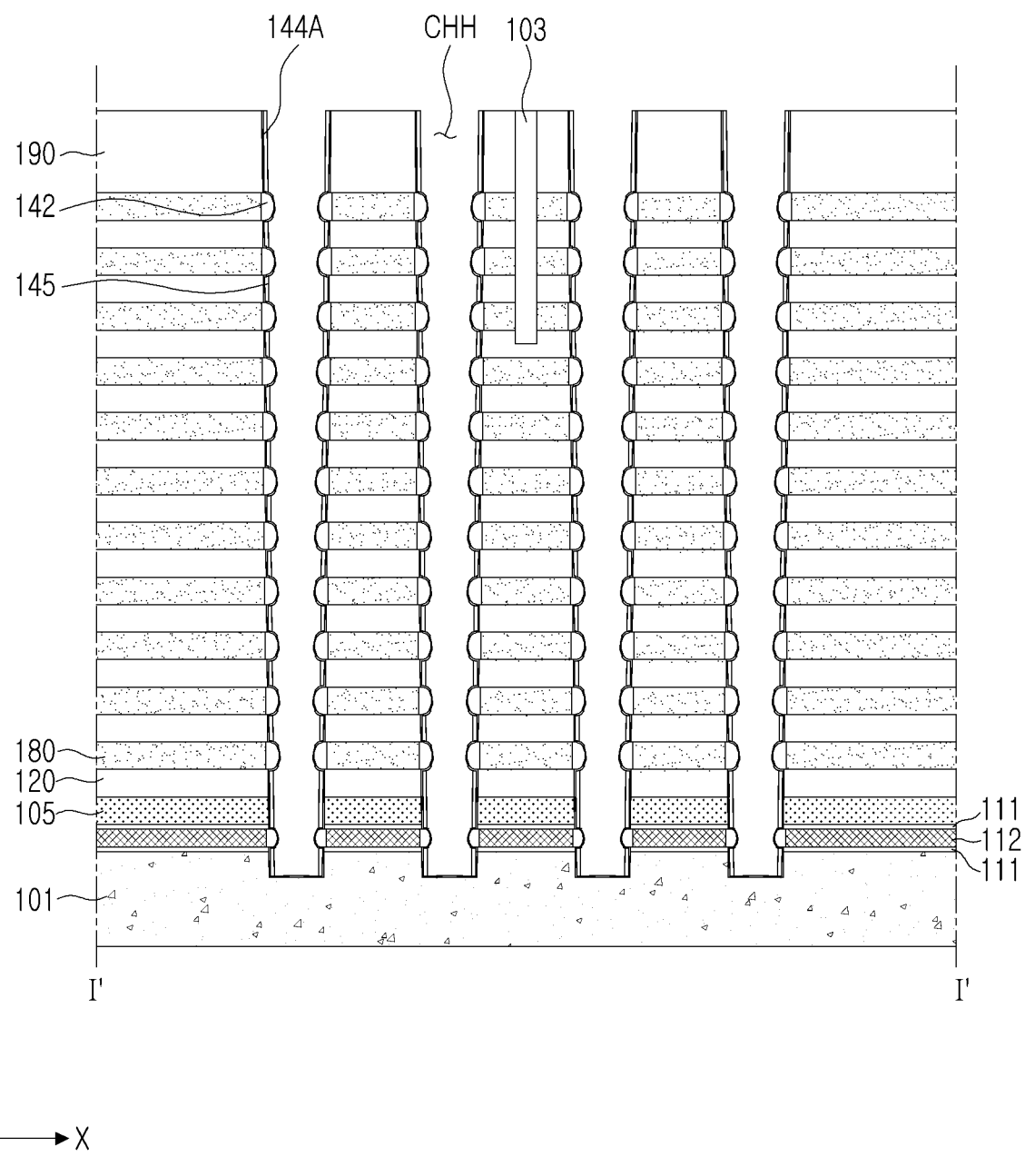

Referring to FIG. 12D, in the channel holes CHH, intermediate insulating layers 145 may be disposed on the interlayer insulating layers 120 and the first layer 144A. The intermediate insulating layers 145 may be formed by depositing an insulating material on an internal side wall of each of the channel holes CHH and partially removing the insulating material to expose partial regions of the first layer 144A protruding internally of the channel holes CHH using a trimming process. Accordingly, the intermediate insulating layers 145 may not remain in regions having the same height level as the sacrificial layers 180, and may remain, e.g., only, in regions having the same height level as the interlayer insulating layers 120.

Figure 12E:
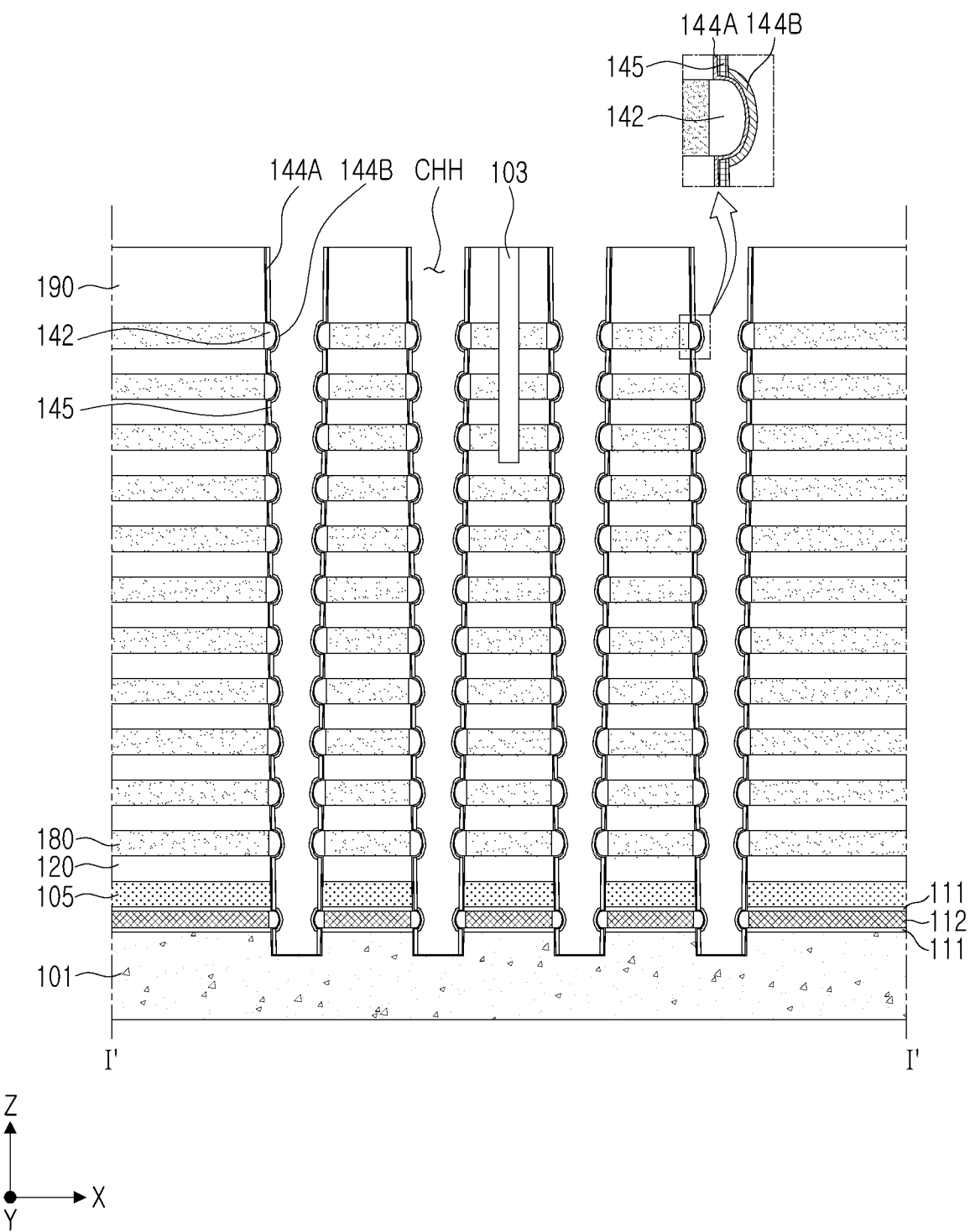

Referring to FIG. 12E, in the channel holes CHH, the second layers 144B of the electric charge storage layer 144 may be disposed on the first layer 144A exposed from the intermediate insulating layers 145.

The second layers 144B may not be disposed on the intermediate insulating layers 145 using a selective growth method, e.g., so may only be disposed on the first layer 144A. For example, the second layers 144B may only be selectively grown on the first layer 144A by controlling a source gas and a reactant gas for deposition. Thicknesses of the second layers 144B may be controlled such that the second layers 144B may not be connected to each other between the sacrificial layers 180 vertically adjacent to each other.

The second layers 144B may have a composition and/or properties different from those of the first layer 144A. For example, the second layers 144B may be formed to have a composition suitable to form a trap for an electric charge as compared to the first layer 144A.

Figure 12F:
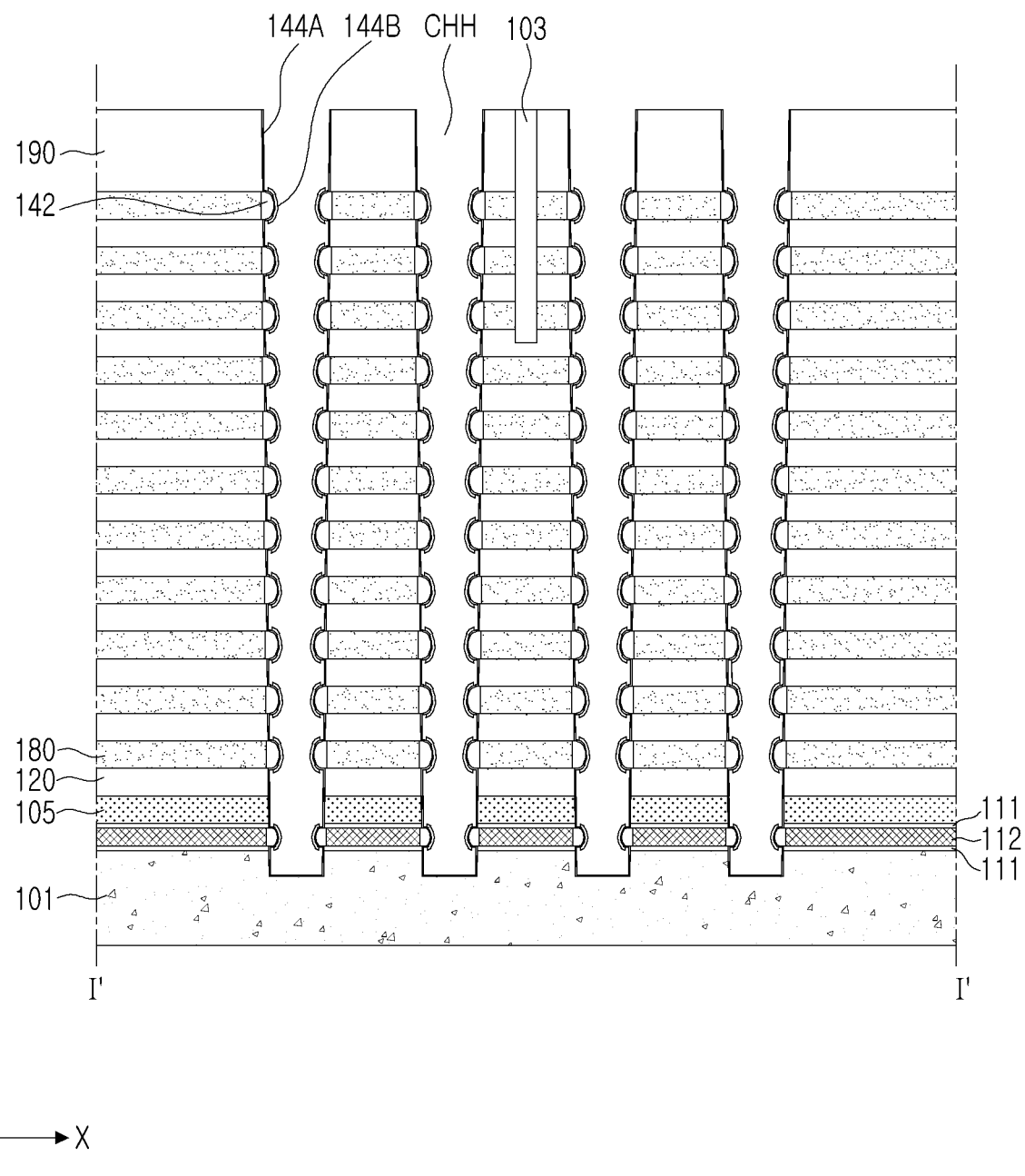

Referring to FIG. 12F, in the channel holes CHH, the intermediate insulating layers 145 exposed between the second layers 144B of the electric charge storage layer 144 may be removed. The intermediate insulating layers 145 may be selectively removed with respect to the first layer 144A and the second layers 144B using a wet-etching method.

Figure 12G:
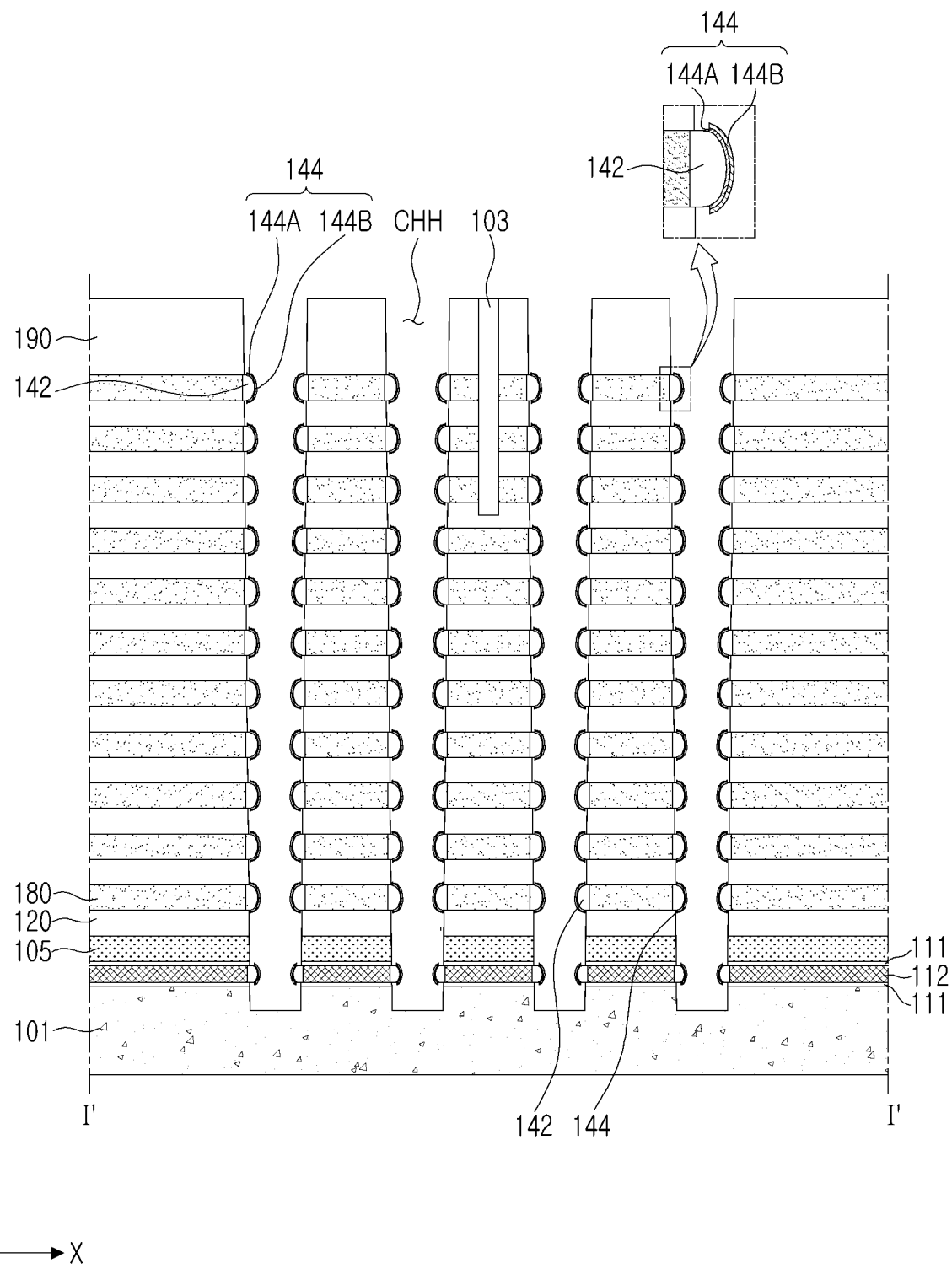

Referring to FIG. 12G, in the channel holes CHH, a portion of the first layer 144A may be removed between the second layers 144B of the electric charge storage layer 144, thereby forming the electric charge storage layer 144.

A portion of the first layer 144A may be selectively removed with respect to the interlayer insulating layers 120 and the first dielectric layers 142 using, e.g., a wet-etching method. In this process, when the first layer 144A is partially removed, a portion of the second layers 144B having similar compositions or the same composition may be removed together. Accordingly, a thickness of each of the second layers 144B may be reduced. Accordingly, each of the electric charge storage layers 144 may be formed to include the first layer 144A and the second layers 144B on corresponding sacrificial layers 180, while being vertically separated from each other between the sacrificial layers 180.

Figure 12H:
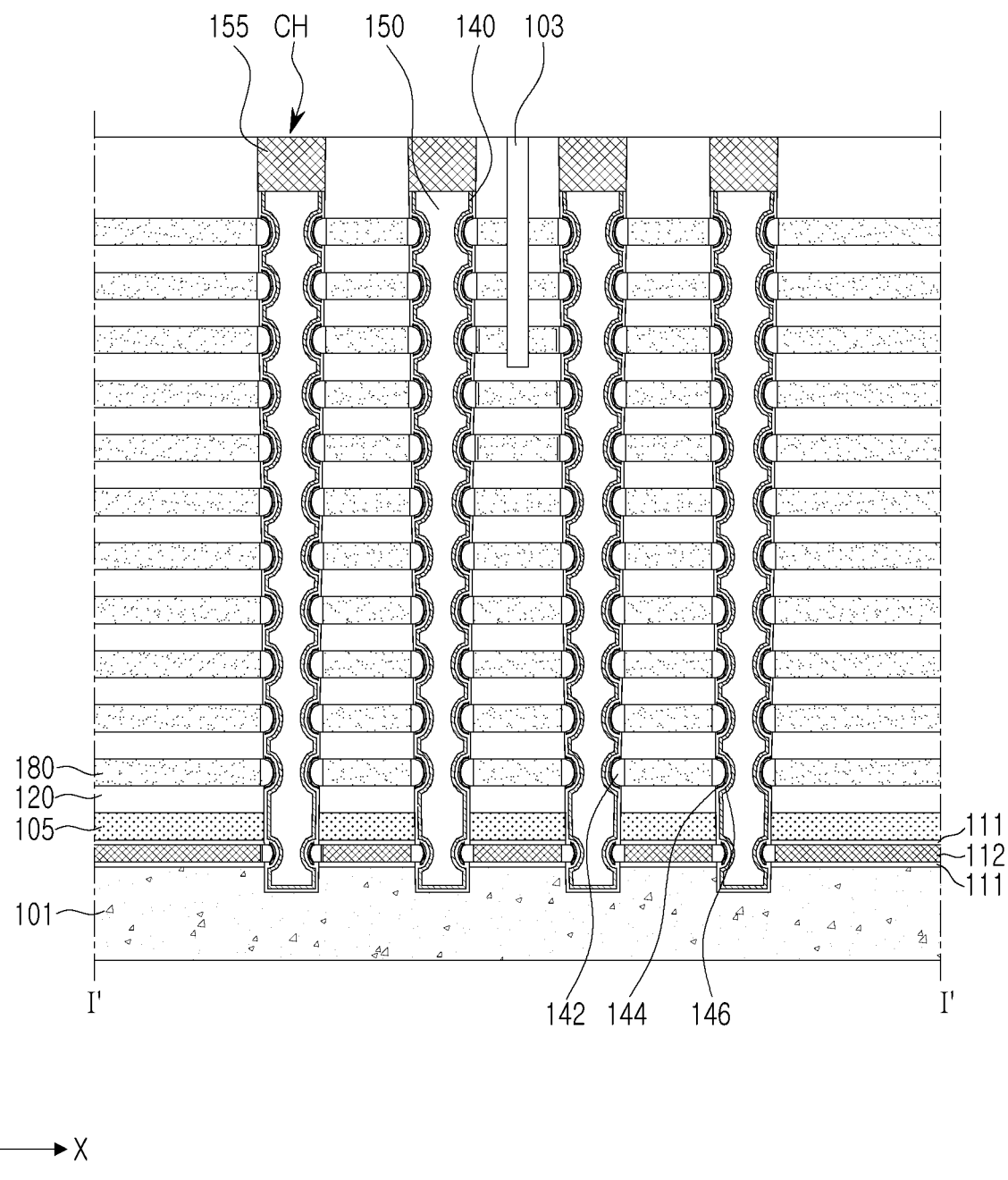

Referring to FIG. 12H, the second dielectric layer 146 and the channel layer 140 may be sequentially formed on an internal side wall of each of the channel holes CHH, and the channel holes CHH may be filled with the channel insulating layers 150. The channel pads 155 may be formed on the channel holes CHH, thereby forming the channel structures CH.

The second dielectric layer 146 may be formed to enclose the first dielectric layers 142 and the electric charge storage layers 144. Each of the second dielectric layer 146 and the channel layer 140 may be formed to extend as a single, e.g., and continuous, layer in a single channel hole CHH.

The channel insulating layers 150 may be formed to fill an internal space of the channel layers 140, and may be formed of an insulating material. In example embodiments, an internal space of the channel layer 140 may be filled with a conductive material, rather than with the channel insulating layers 150. The channel pads 155 may be formed of a conductive material, and may be formed of polycrystalline silicon.

Figure 12I:
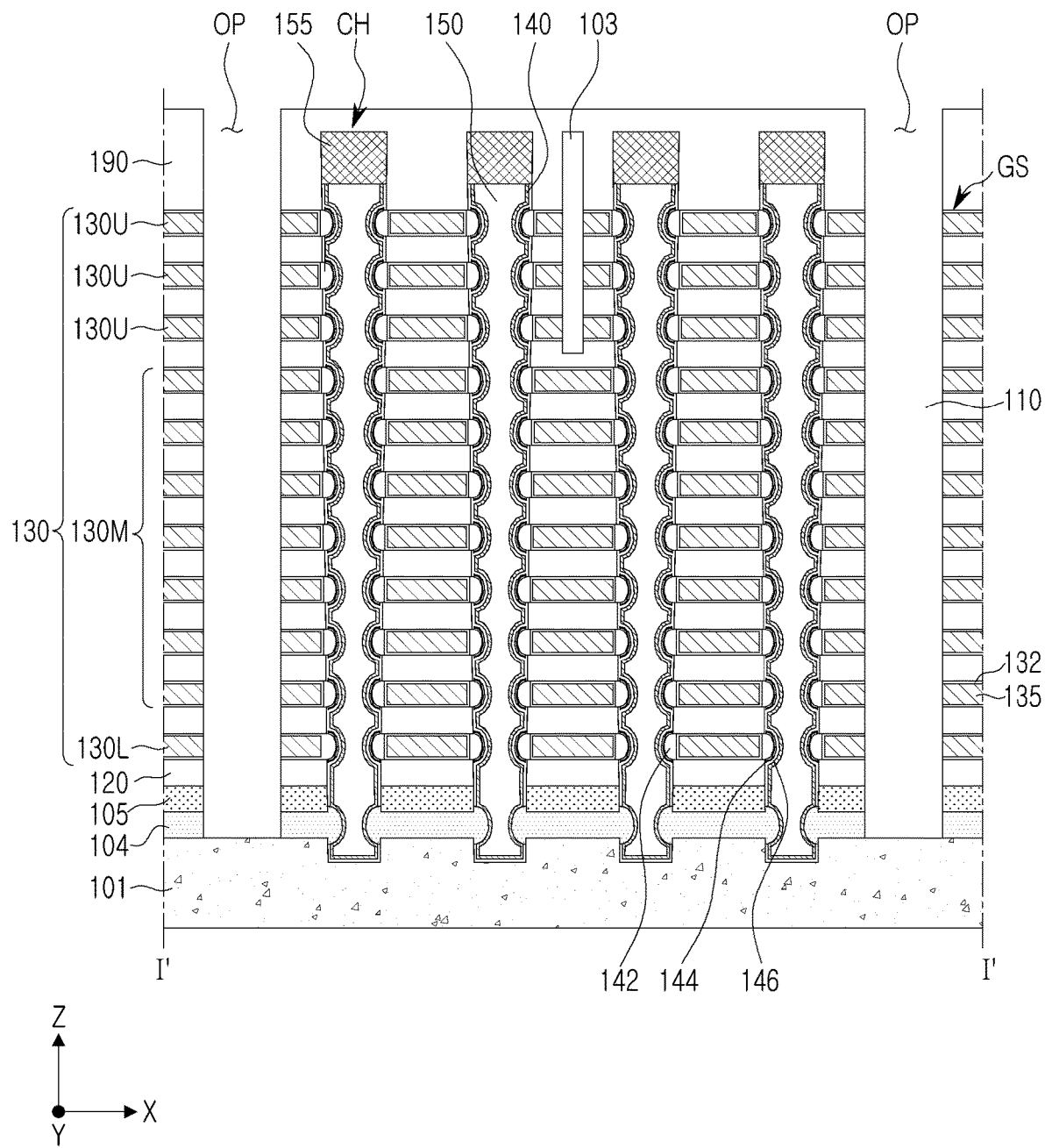

Referring to FIG. 12I, openings OP penetrating the stack structure of the sacrificial layers 180 and the interlayer insulating layers 120 may be formed, the sacrificial layers 180 exposed through the openings OP may be removed, and the gate layers 130 may be formed.

Before the openings OP are formed, the cell region insulating layer 190 may be additionally formed on the channel pads 155. The openings OP may be disposed in the positions of the separation regions SR illustrated in FIGS. 1 and 2. The openings OP may be formed by forming a mask layer using a photolithography process, and anisotropically etching the stack structure. The openings OP may be configured to have a form of a trench extending in the y direction, and the substrate 101 may be exposed in a lower portion of the openings OP.

Before removing the sacrificial layers 180, the first and second horizontal sacrificial layers 111 and 112 may be removed, and the first horizontal conductive layer 104 may be formed. To protect the sacrificial layers 180, spacer layers may be formed on a side wall of each of the openings OP, the second horizontal sacrificial layer 112 may be removed first, and the first horizontal sacrificial layers 111 may be removed. The first and second horizontal sacrificial layers 111 and 112 may be removed, e.g., by a wet-etching process. In the process of removing the first horizontal sacrificial layers 111, the first dielectric layer 142 exposed in a region from which the second horizontal sacrificial layer 112 is removed may be removed together, and accordingly, the electric charge storage layer 144 may also be removed. The first horizontal conductive layer 104 may be formed by depositing a conductive material in a region from which the first and second horizontal sacrificial layers 111 and 112 are removed, and the spacer layers may be removed. The first horizontal conductive layer 104 may be directly in contact with the channel layer 140.

The sacrificial layers 180 may be selectively removed with respect to the interlayer insulating layers 120 using, e.g., a wet-etching process. Accordingly, a plurality of lateral openings may be formed between the interlayer insulating layers 120, and each of the gate layers 130 including the gate dielectric layer 132 and the gate conductive layer 135 may be formed by depositing a dielectric material and a conductive material in order on the lateral openings.

In example embodiments, a process of expanding the lateral openings may be further performed by removing the sacrificial layers 180 and removing a portion of the interlayer insulating layers 120 and a portion of the first dielectric layers 142, exposed through the lateral openings. In this case, as in the example embodiment illustrated in FIG. 3B, each of the gate layers 130 may have an expanded shape.

Referring back to FIG. 2, the conductive material deposited in the openings OP may be removed through an additional process. The separation insulating layers 110 may be formed to fill the opening OP. Accordingly, the semiconductor device 100 may be manufactured.

Figure 13A:
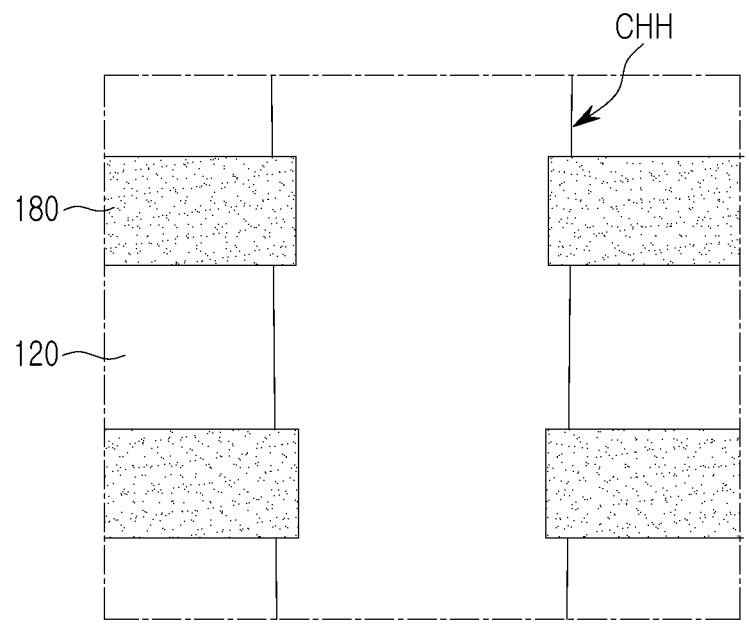
FIGS. 13A and 13B are schematic cross-sectional views illustrating stages in a method of manufacturing a semiconductor device according to an example embodiment.
Figure 13B:
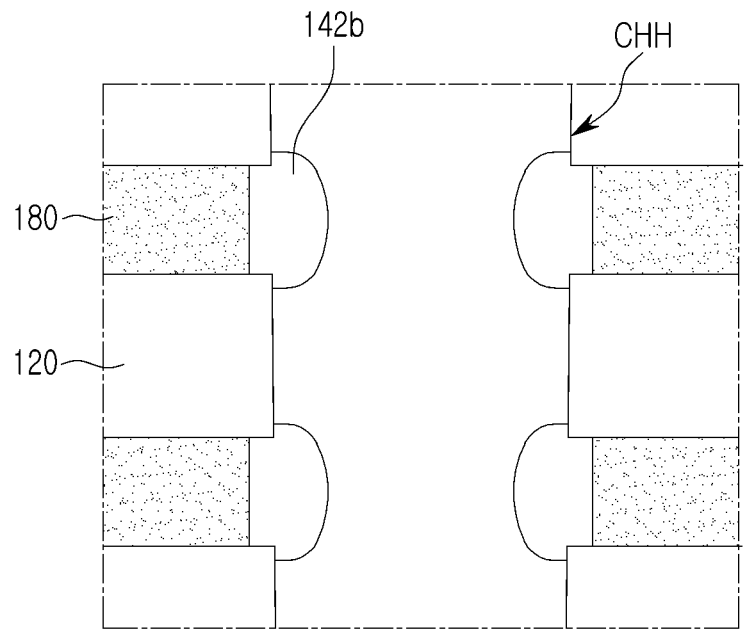

FIGS. 13A and 13B are schematic cross-sectional views illustrating stages in a method of manufacturing a semiconductor device according to an example embodiment. FIGS. 13A and 13B illustrate cross-sectional views corresponding to FIG. 4B.

Referring to FIG. 13A, first, the process described with reference to FIG. 12A may be performed to form the channel holes CHH.

As illustrated in FIG. 13A, the interlayer insulating layers 120 may be recessed by partially removing the interlayer insulating layers 120 exposed through the channel holes CHH. Accordingly, the sacrificial layers 180 may be formed to protrude into the channel holes CHH.

Referring to FIG. 13B, the first dielectric layers 142b may be formed by oxidizing the sacrificial layers 180 exposed through the channel holes CHH.

The first dielectric layers 142b may be formed to partially extend to side surfaces of the interlayer insulating layers 120. In example embodiments, depending on thicknesses of the first dielectric layers 142b, a length of each of regions disposed between the interlayer insulating layers 120 in the first dielectric layers 142b may be varied. For example, the first dielectric layers 142b may only be disposed in internal sides of the channel holes CHH to be prevented from overlapping the interlayer insulating layers 120.

The above-described process described with reference to FIGS. 12C to 12I may be performed, and the semiconductor device 100b described in FIG. 4B may be manufactured. In example embodiments, in the process described with reference to FIG. 12I, when the sacrificial layers 180 is removed, and a process of expanding the lateral openings is performed, a structure may be formed in which regions of the first dielectric layers 142b are removed, e.g., regions positioned to overlap the interlayer insulating layers 120 between the interlayer insulating layers 120.

Figure 14A:
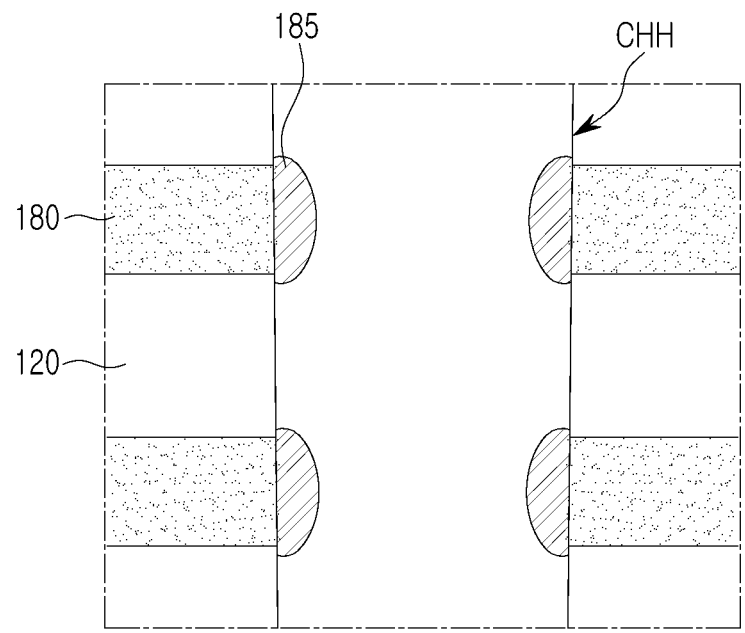
FIGS. 14A and 14B are schematic cross-sectional views illustrating stages in a method of manufacturing a semiconductor device according to an example embodiment.
Figure 14B:
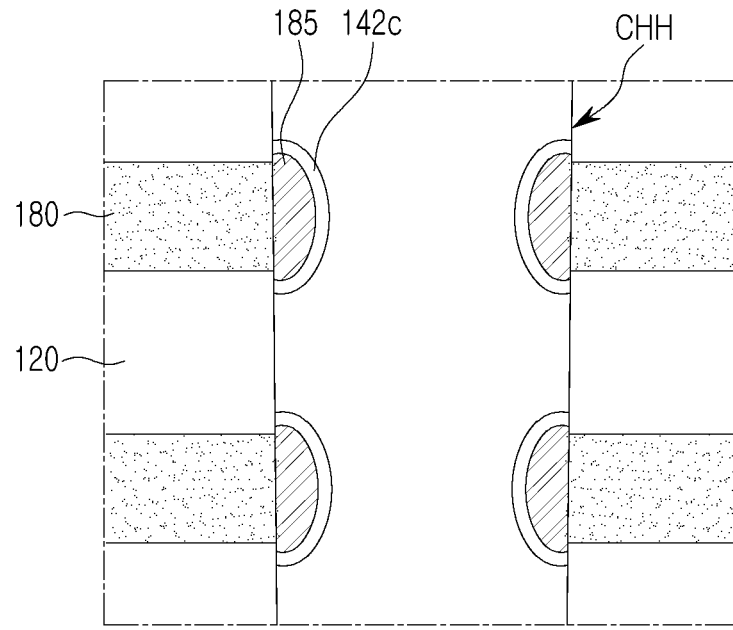

FIGS. 14A and 14B are schematic cross-sectional views illustrating stages in a method of manufacturing a semiconductor device according to an example embodiment. FIGS. 14A and 14B illustrating cross-sectional views corresponding to FIG. 4C.

Referring to FIG. 14A, the process described with reference to FIG. 12A may be performed, thereby forming the channel holes CHH.

As illustrated in FIG. 14A, side-wall sacrificial layers 185 may be formed on the sacrificial layers 180 exposed through the channel holes CHH using a selective growth method. The side-wall sacrificial layers 185 may be formed to protrude into the channel holes CHH, and may include, e.g., polycrystalline silicon.

Referring to FIG. 14B, at least a portion of each of the side-wall sacrificial layers 185 exposed through the channel holes CHH may be oxidized, thereby forming the first dielectric layers 142c. The first dielectric layers 142c may be configured to surround the side-wall sacrificial layers 185 on an internal side wall of each of the channel holes CHH and to be in contact with the interlayer insulating layers 120. In FIG. 14B, an embodiment in which the side-wall sacrificial layers 185 is partially oxidized is shown, but in example embodiments, the first dielectric layers 142c may be formed by oxidizing all the side-wall sacrificial layers 185. In this case, in a final structure illustrated in FIG. 4C, the gate layers 130c may not protrude into the channel holes CHH.

The same process described with reference to FIGS. 12C to 12I may be performed, and the semiconductor device 100c illustrated in FIG. 4C may be manufactured. In the process described with reference to FIGS. 12I, the sacrificial layers 180 may be removed, and a process of removing remaining side-wall sacrificial layers 185 may be performed, and the gate layers 130 may be formed.

Figure 15A:
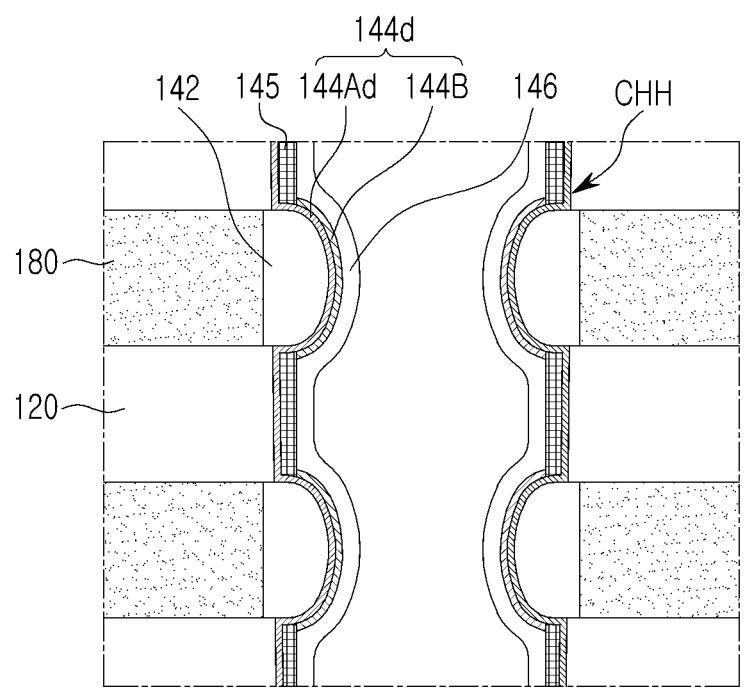
FIGS. 15A and 15B are schematic cross-sectional views illustrating stages in a method of manufacturing a semiconductor device according to an example embodiment.
Figure 15B:
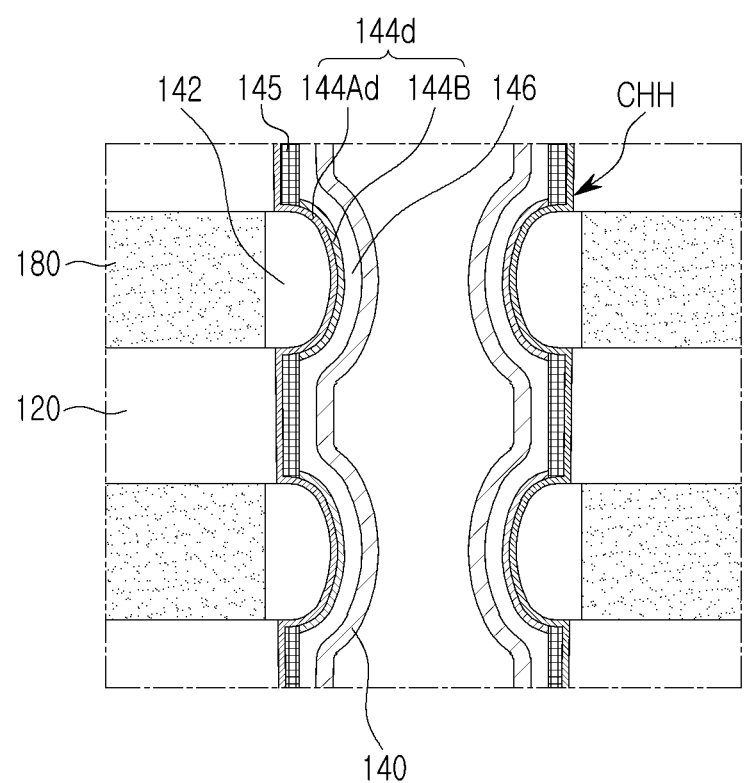

FIGS. 15A and 15B are schematic cross-sectional views illustrating stages in a method of manufacturing a semiconductor device according to an example embodiment. FIGS. 15A and 15B illustrate cross-sectional views corresponding to FIG. 5B.

Referring to FIG. 15A, the process described with reference to FIGS. 12A to 12E may be performed to form the electric charge storage layers 144d including the first layer 144Ad and the second layers 144B.

As illustrated in FIG. 15A, the second dielectric layer 146 covering the electric charge storage layers 144d in channel holes CHH may be formed. In the example embodiment, differently from the processes described with reference to FIGS. 12F and 12G, the intermediate insulating layers 145 may not be removed, and a portion of the first layer 144Ad may not be removed.

Referring to FIG. 15B, in the channel holes CHH, the channel layer 140 may be formed on the second dielectric layer 146. The process described with reference to FIGS. 12H and 12I may be performed, and the semiconductor device 100d illustrated in FIG. 5A and 5B may be manufactured.

Figure 16A:
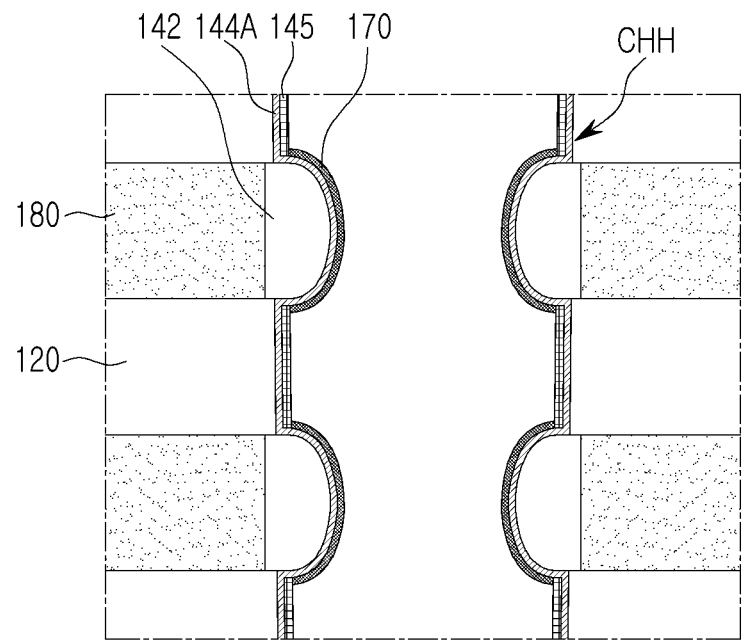
FIGS. 16A to 16D are schematic cross-sectional views illustrating stages in a method of manufacturing a semiconductor device according to an example embodiment.
Figure 16B:
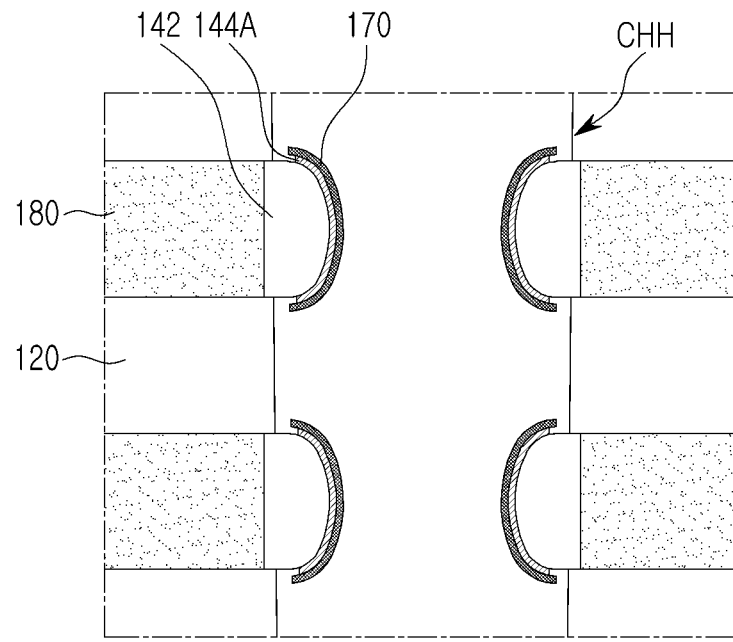

FIGS. 16A and 16B are schematic cross-sectional views illustrating stages in a method of manufacturing a semiconductor device according to an example embodiment. FIGS. 16A and 16B illustrate cross-sectional views corresponding to FIG. 6B.

Referring to FIG. 16A, the process described with reference to FIGS. 12A to 12D may be performed, and the intermediate insulating layers 145 may be formed.

As illustrated in FIG. 16A, mask layers 170 may be formed on the first layer 144A exposed from the intermediate insulating layers 145. The mask layers 170 may not be formed on the intermediate insulating layers 145 but may be formed on the first layer 144A using a selective growth method. For example, by controlling a source gas and a reactant gas for deposition, the mask layers 170 may be selectively grown on the first layer 144A. Thicknesses of the mask layers 170 may be controlled such that the mask layers 170 may not be connected to each other between the sacrificial layers 180 vertically adjacent to each other.

Referring to FIG. 16B, in the channel holes CHH, a portion of the intermediate insulating layers 145 and the first layer 144A exposed between the mask layers 170 may be removed. The intermediate insulating layers 145 may be selectively removed with reference to a first layer 144A. Next, the first layer 144A may be removed from a region exposed from the mask layers 170 to form a plurality of the first layers 144A separated from each other. As illustrated in FIG. 16B, the first layer 144A may be partially removed on ends in contact with the mask layers 170.

Figure 16C:
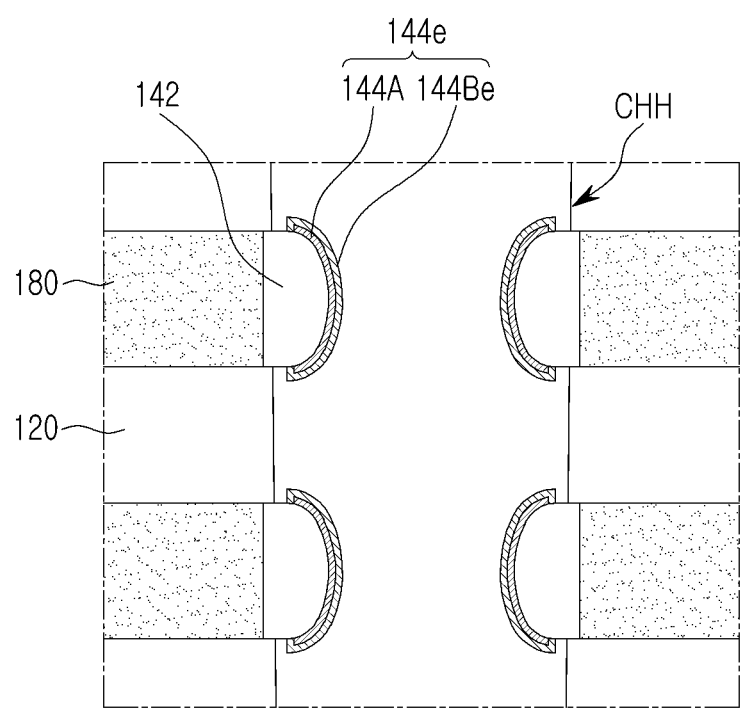

Referring to FIG. 16C, the mask layers 170 may be removed, and second layers 144Be may be formed on the first layer 144A, thereby forming the electric charge storage layer 144e.

The second layers 144Be may be selectively grown on the first layer 144A as in the example embodiment described with reference to FIG. 12E. In this process, however, as the intermediate insulating layers 145 are removed, the second layers 144Be may be configured to entirely surround ends of the first layer 144A.

Figure 16D:
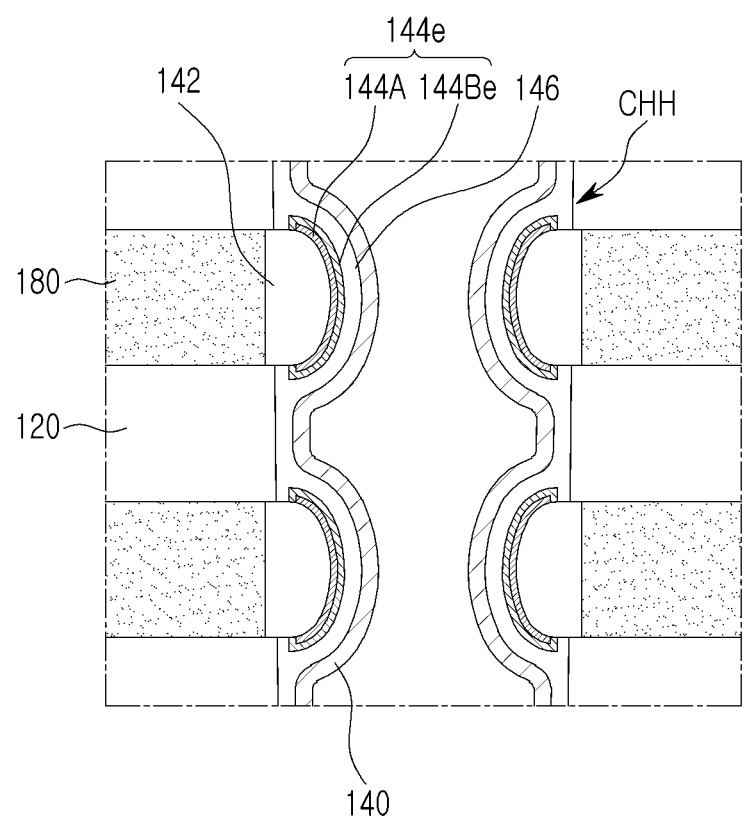

Referring to FIG. 16D, in the channel holes CHH, the second dielectric layer 146 covering the electric charge storage layer 144e and the channel layer 140 may be sequentially formed. The process described with reference to FIGS. 12H and 12I may be performed, thereby manufacturing the semiconductor device 100e illustrated in FIGS. 6A and 6B.

Figure 17A:
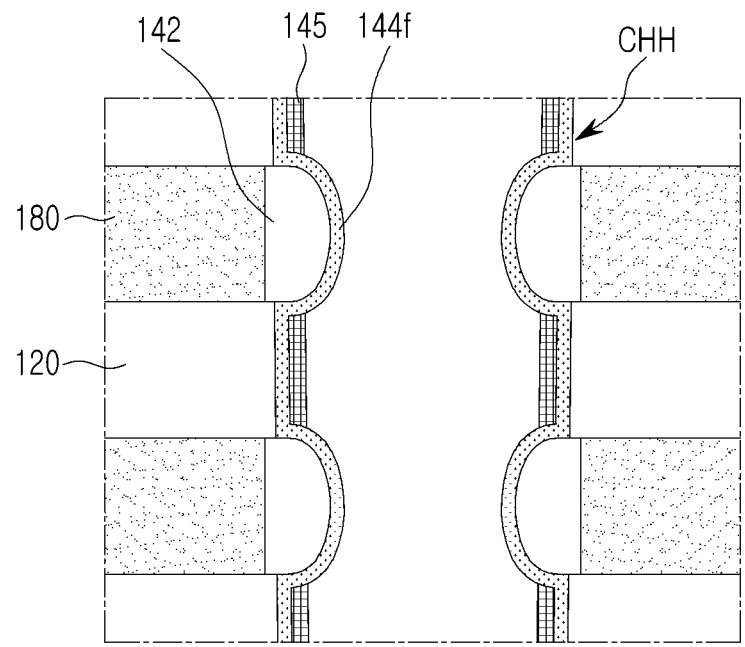
FIGS. 17A to 17E are schematic cross-sectional views illustrating stages in a method of manufacturing a semiconductor device according to an example embodiment.
Figure 17B:
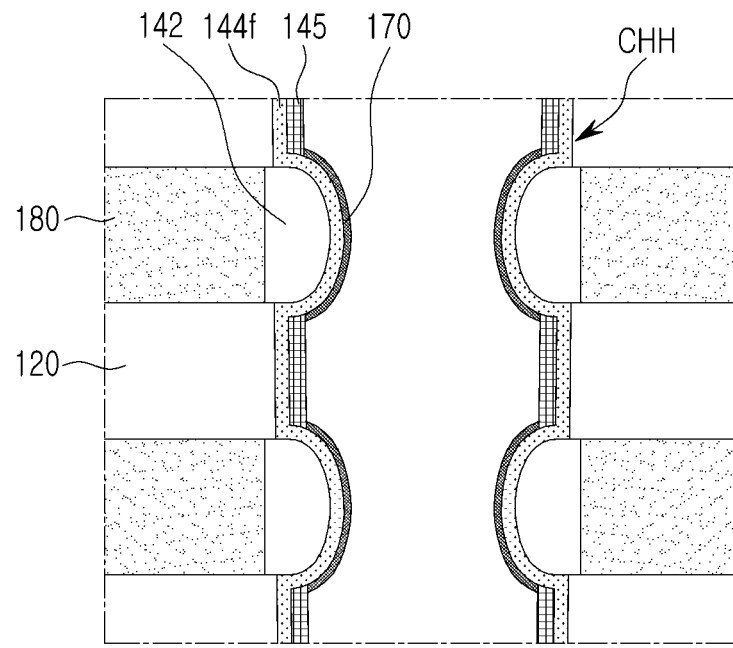
Figure 17C:
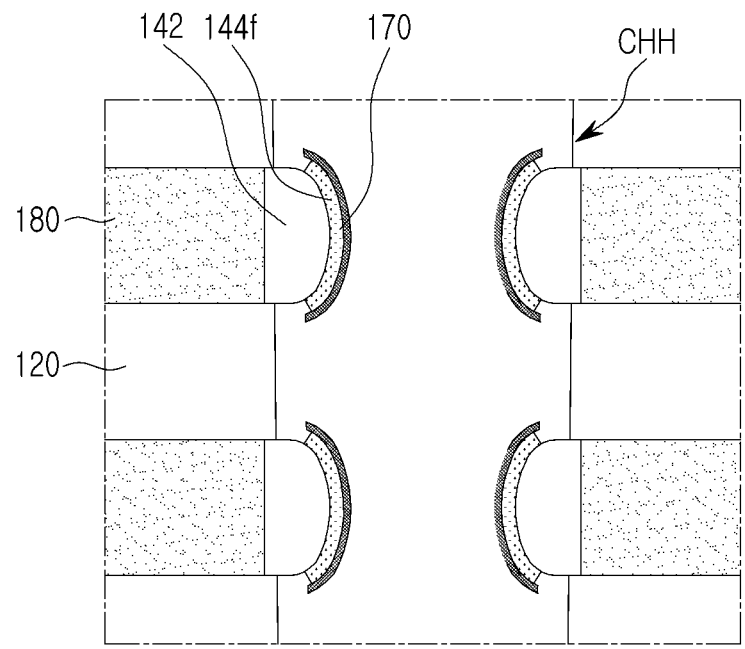
Figure 17D:
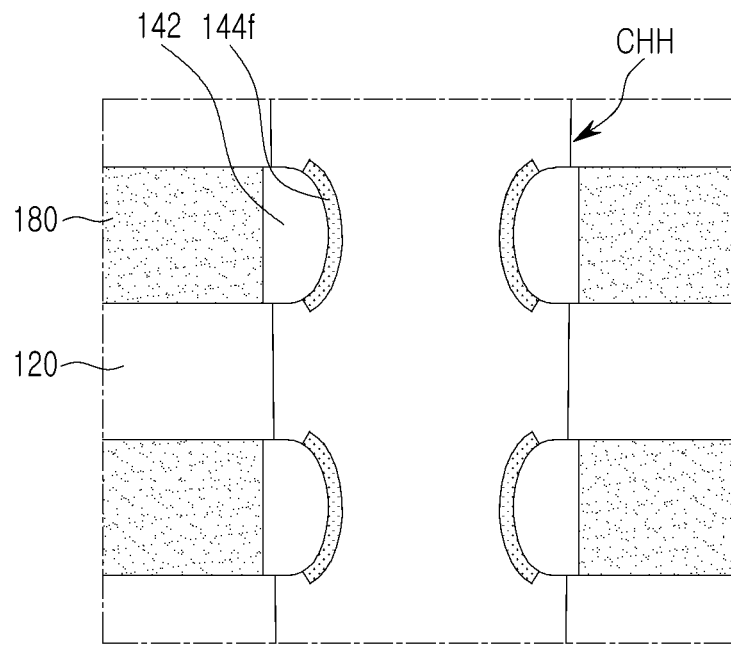
Figure 17E:
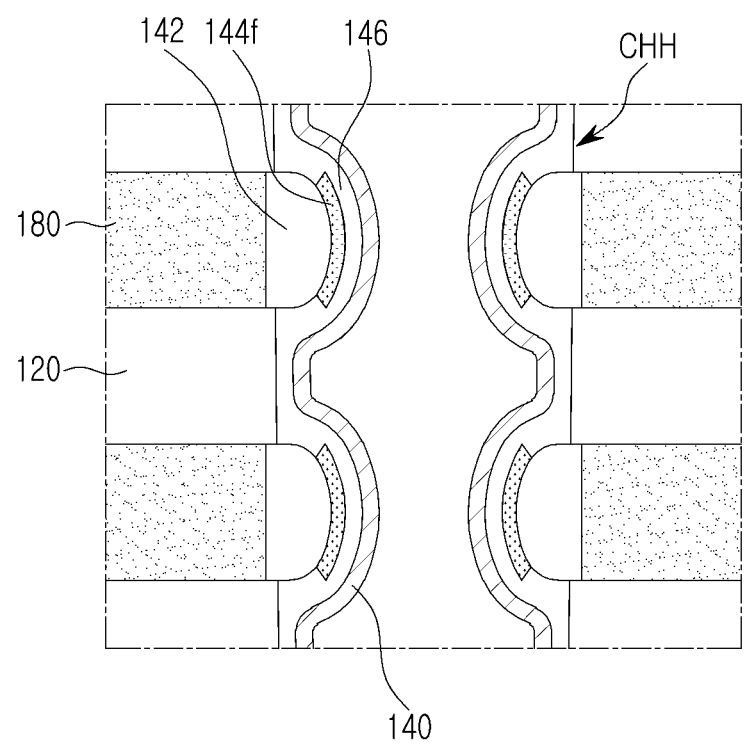

FIGS. 17A to 17E are schematic cross-sectional views illustrating stages in a method of manufacturing a semiconductor device according to an example embodiment. FIGS. 17A and 17E illustrate cross-sectional views corresponding to FIG. 7B.

Referring to FIG. 17A, the process described with reference to FIGS. 12A to 12D may be performed to form the electric charge storage layer 144f and the intermediate insulating layers 145. However, in this example embodiment, as the electric charge storage layer 144f is formed using a single deposition process, the electric charge storage layer 144f may be formed to have a thickness greater than that of the first layer 144A illustrated in FIG. 12D.

Referring to FIG. 17B, in the channel holes CHH, the mask layers 170 may be formed on the electric charge storage layer 144f exposed from the intermediate insulating layers 145. The mask layers 170 may only be formed on the electric charge storage layer 144f using a selective growth method as described with reference to FIG. 16A.

Referring to FIG. 17C, in the channel holes CHH, the intermediate insulating layers 145 and a portion of the electric charge storage layer 144f, exposed to a region between the mask layers 170, may be removed. The intermediate insulating layers 145 and a portion of the electric charge storage layer 144f may be removed sequentially using a wet-etching process as described with reference to FIG. 16B. Accordingly, the electric charge storage layer 144f may be formed as a plurality of the electric charge storage layers 144f separated from each other between the sacrificial layers 180.

Referring to FIG. 17D, the mask layers 170 may be removed. The mask layers 170 may be selectively removed with respect to the first dielectric layers 142 and the electric charge storage layer 144f.

Referring to FIG. 17E, in the channel holes CHH, the second dielectric layer 146 and the channel layer 140 may be formed sequentially. The process described with reference to FIGS. 12H and 12I may be performed, and the semiconductor device 100f illustrated in FIG. 7A and 7B may be manufactured.

Figure 18A:
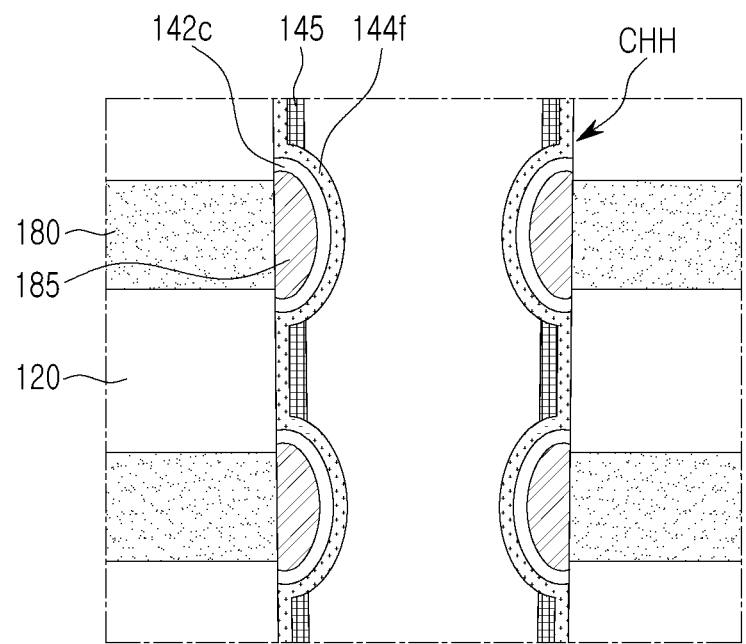
FIGS. 18A to 18E are schematic cross-sectional views illustrating stages in a method of manufacturing a semiconductor device according to an example embodiment.
Figure 18B:
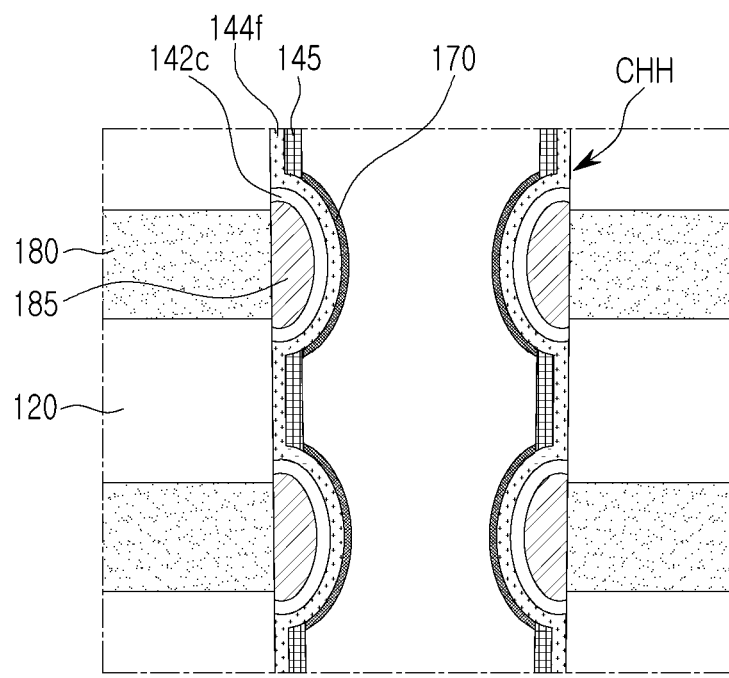
Figure 18C:
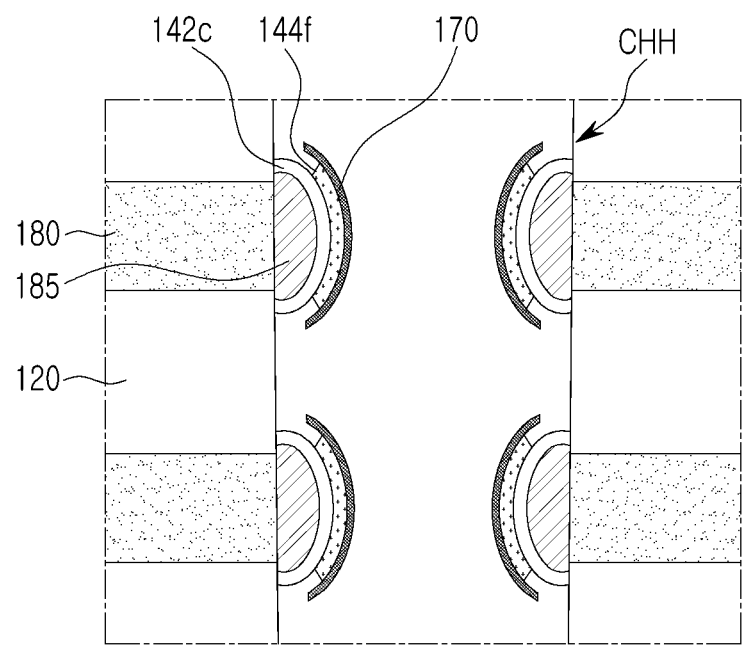
Figure 18D:
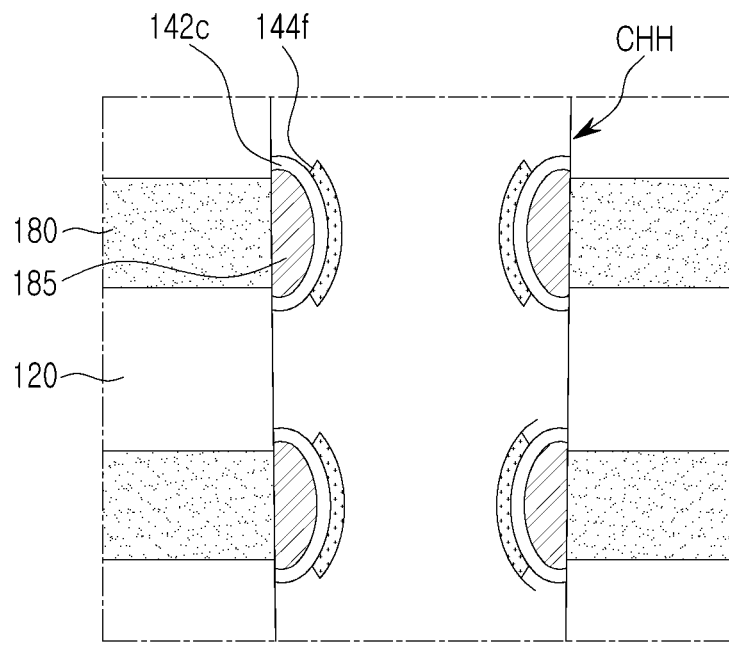
Figure 18E:
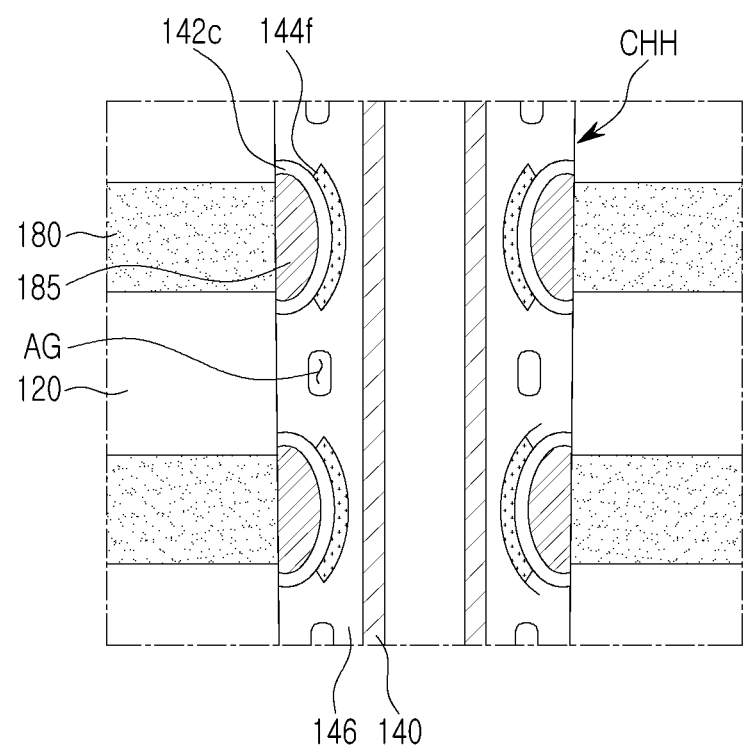

FIGS. 18A to 18E are schematic cross-sectional views illustrating stages in a method of manufacturing a semiconductor device according to an example embodiment. FIGS. 18A and 18E illustrate cross-sectional views corresponding to FIG. 8A.

Referring to FIG. 18A, the process described with reference to FIGS. 14A and 14B may be performed to form side-wall sacrificial layers 185 and first dielectric layers 142c.

As illustrated in FIG. 18A, the electric charge storage layer 144f may be formed on the first dielectric layers 142c, and the intermediate insulating layers 145 may be formed on side surfaces of the interlayer insulating layers 120. The electric charge storage layer 144f may be formed to have a relatively great thickness as described with reference to FIG. 17A. The intermediate insulating layers 145 may only be formed in a region in which the electric charge storage layer 144f does not protrude, as described with reference to FIG. 12D.

Referring to FIG. 18B, in the channel holes CHH, the mask layers 170 may be formed on the electric charge storage layer 144f exposed from the intermediate insulating layers 145. The mask layers 170 may only be formed on the electric charge storage layer 144f using a selective growth method as described with reference to FIGS. 16A and 17B.

Referring to FIG. 18C, in the channel holes CHH, the intermediate insulating layers 145 and a portion of the electric charge storage layer 144f, exposed to a region between the mask layers 170, may be removed. A process of removing the intermediate insulating layers 145 and a portion of the electric charge storage layer 144f may be performed as described with reference to FIG. 17C. Accordingly, a plurality of the electric charge storage layers 144f, separated from each other between the sacrificial layers 180, may be formed.

Referring to FIG. 18D, the mask layers 170 may be removed. The mask layers 170 may be selectively removed with reference to the first dielectric layers 142c and the electric charge storage layer 144f.

Referring to FIG. 18E, the second dielectric layer 146 covering the electric charge storage layer 144f and the channel layer 140 may be formed sequentially in the channel holes CHH. While the second dielectric layer 146 is formed, air gaps AG may be formed between the electric charge storage layers 144f vertically adjacent to each other.

Whether to form the air gaps AG and a size of each of the air gaps AG may be controlled in accordance with structural elements such as thicknesses of the first dielectric layer 142c, the electric charge storage layers 144f, and the interlayer insulating layers 120 and process conditions for forming the second dielectric layer 146 and film properties of the second dielectric layer 146. Then, the process described with reference to FIGS. 12H and 12I may be performed, thereby manufacturing the semiconductor device 100g illustrated in FIG. 8A.

FIGS. 19A to 19F are schematic cross-sectional views illustrating stages in a method of manufacturing a semiconductor device according to an example embodiment. FIGS. 19A to 19F illustrate cross-sectional views corresponding to FIG. 8B.

Figure 19A:
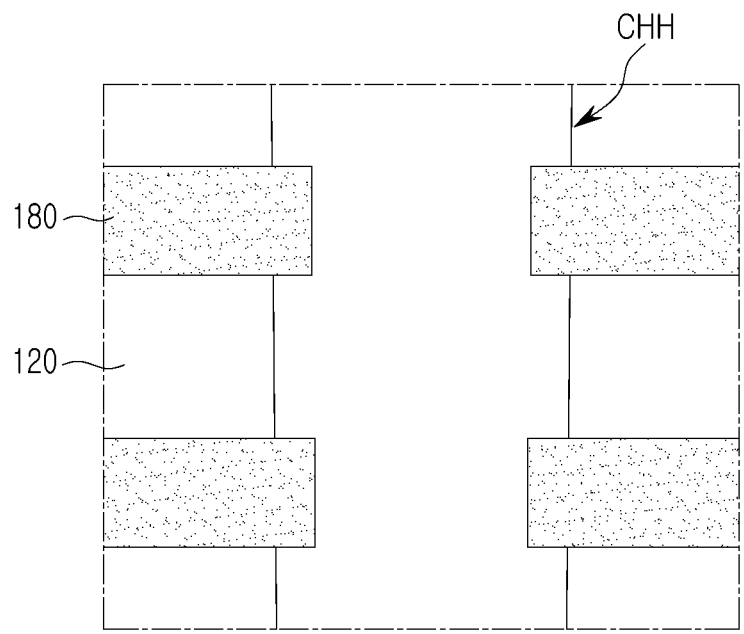
FIGS. 19A to 19F are schematic cross-sectional views illustrating stages in a method of manufacturing a semiconductor device according to an example embodiment.

Referring to FIG. 19A, the process described with reference to FIG. 13A may be performed, and the sacrificial layers 180 may be formed to protrude into the channel holes CHH.

Figure 19B:
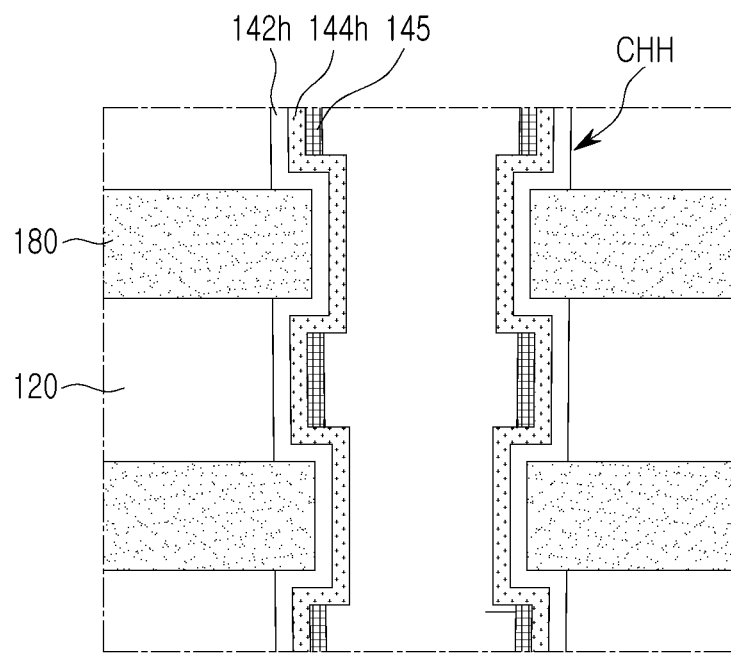

Referring to FIG. 19B, in the channel holes CHH, the first dielectric layers 142h and the electric charge storage layer 144 may be formed sequentially, and the intermediate insulating layers 145 may be formed on a side surface of each of the interlayer insulating layers 120. The electric charge storage layer 144h may be formed to have a relatively great thickness as described with reference to FIGS. 17A and 18A. The intermediate insulating layers 145 may only be formed in a region in which the electric charge storage layer 144h does not protrude as described with reference to FIG. 12D.

Figure 19C:
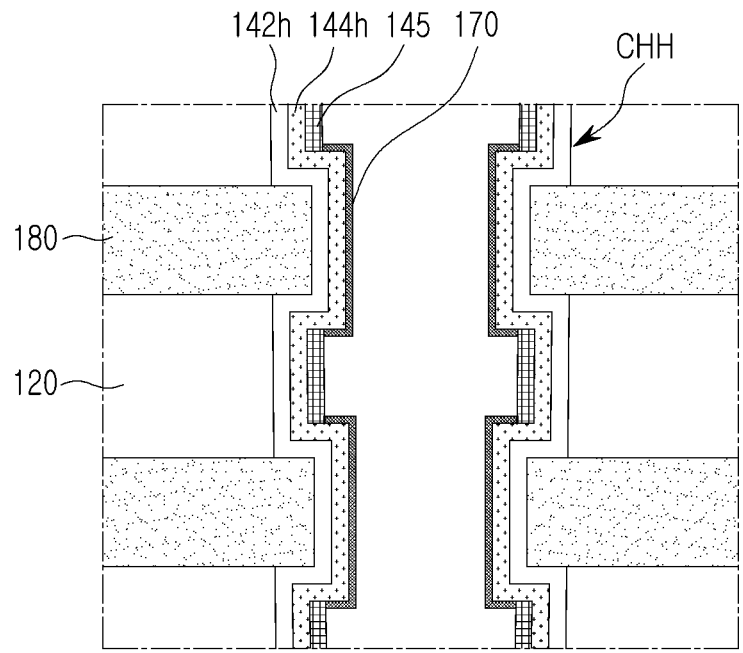

Referring to FIG. 19C, in the channel holes CHH, the mask layers 170 may be formed on the electric charge storage layer 144h exposed from the intermediate insulating layers 145. The mask layers 170 may only be formed on the electric charge storage layer 144h using a selective growth method.

Figure 19D:
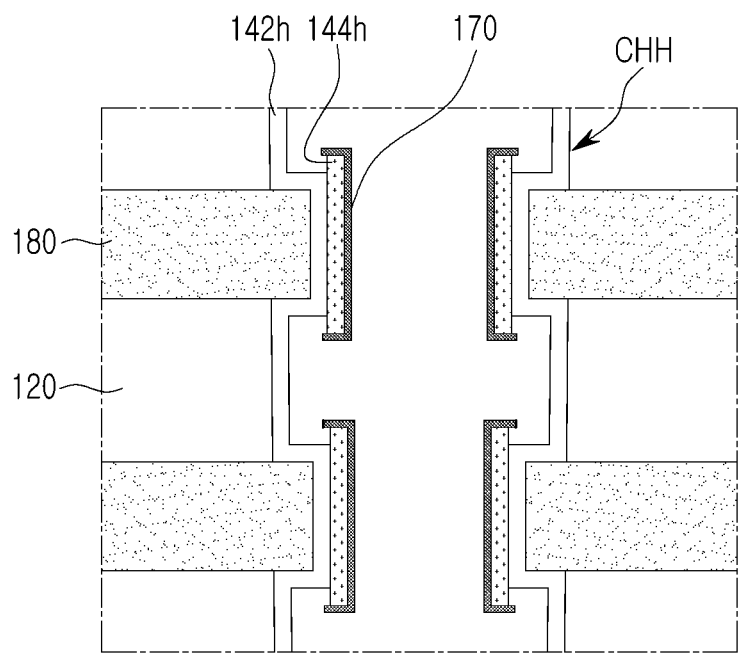

Referring to FIG. 19D, in the channel holes CHH, the intermediate insulating layers 145 and a portion of the electric charge storage layer 144h exposed to a region between the mask layers 170 may be removed. A process of removing the intermediate insulating layers 145 and a portion of the electric charge storage layer 144h may be performed as described with reference to FIGS. 17C and 18C. Accordingly, a plurality of the electric charge storage layers 144f, separated from each other between the sacrificial layers 180, may be formed.

Figure 19E:
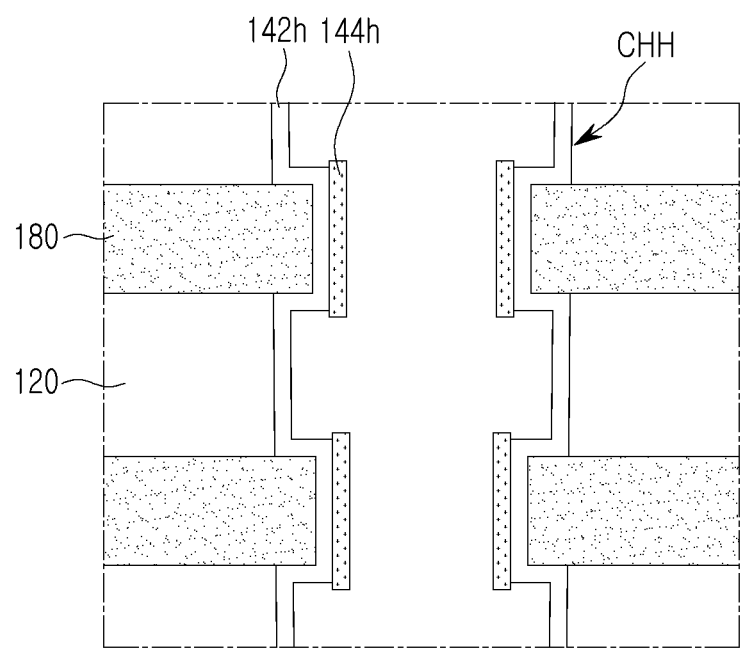

Referring to FIG. 19E, the mask layers 170 may be removed. The mask layers 170 may be selectively removed with reference to the first dielectric layers 142h and the electric charge storage layer 144h.

Figure 19F:
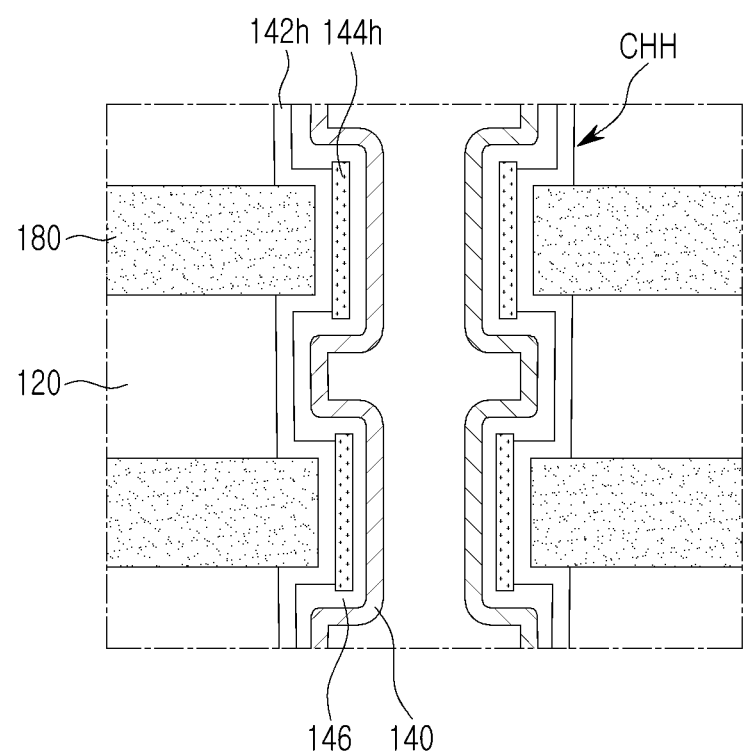

Referring to FIG. 19F, in the channel holes CHH, the second dielectric layer 146 covering the electric charge storage layer 144h and the channel layer 140 may be formed sequentially. The process described with reference to FIGS. 12H and 12I may be performed, thereby manufacturing the semiconductor device 100H illustrated in FIG. 8B.

By way of summation and review, forming at least a portion of the electric charge storage layer or the mask layer using a selective growth method, and separating at least a portion of the electric charge storage layers from each other between memory cells provides a semiconductor device having improved reliability. That is, electric charge storage layers may be separated from each other between gate electrodes vertically adjacent to each other, and a second dielectric layer may cover upper and lower surfaces of the first dielectric layer, so retention properties therein may be improved, e.g., minimize degradation due to a charge spreading phenomenon in a vertical direction, to improve implementation of a multi bit cell.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   gate layers stacked on a substrate and spaced apart from each other in a first direction perpendicular to an upper surface of the substrate;
   interlayer insulating layers alternately stacked with the gate layers on the substrate; and
   channel structures penetrating the gate layers and extending in the first direction, each of the channel structures including:
   first dielectric layers on side surfaces of the gate layers, respectively, each of the first dielectric layers being on a single side surface of a corresponding one of the gate layers, and the first dielectric layers being spaced apart from each other in the first direction,
   electric charge storage layers on side surfaces of the first dielectric layers, respectively, the electric charge storage layers being spaced apart from each other in the first direction,
   a second dielectric layer extending perpendicularly to the substrate to conform to side surfaces of the electric charge storage layers, and
   a channel layer extending perpendicularly to the substrate on a side surface of the second dielectric layer,
   wherein each of the first dielectric layers has a first maximum length in the first direction, and each of the electric charge storage layers has a second maximum length greater than the first maximum length in the first direction, and
   wherein the second dielectric layer contacts an upper portion and a lower potion of each of the first dielectric layers.

2. The semiconductor device as claimed in claim 1, wherein the second dielectric layer contacts an upper portion and a lower portion of each of the first dielectric layers.

3. The semiconductor device as claimed in claim 1, wherein the second dielectric layer contacts side surfaces of the interlayer insulating layers between the gate layers vertically adjacent to each other.

4. The semiconductor device as claimed in claim 1, wherein the electric charge storage layers are surrounded by the first dielectric layers and the second dielectric layer.

5. The semiconductor device as claimed in claim 1, wherein each of the gate layers has a third maximum length in the first direction, the third maximum length being the same as or greater than the first maximum length.

6. The semiconductor device as claimed in claim 1, wherein the first dielectric layers are localized on the side surfaces of the gate layers, such that the first dielectric layers do not extend to side surfaces of the interlayer insulating layers.

7. The semiconductor device as claimed in claim 1, wherein the side surfaces of the first dielectric layers have rounded shapes curved toward the channel layer.

8. The semiconductor device as claimed in claim 7, wherein the side surfaces of the electric charge storage layers and the side surface of the second dielectric layer have rounded shapes curved toward the channel layer.

9. The semiconductor device as claimed in claim 1, wherein the electric charge storage layers include first layers and second layers sequentially stacked on the side surfaces of the first dielectric layers, the first and second layers having different compositions or properties.

10. The semiconductor device as claimed in claim 9, wherein the second layers of the electric charge storage layers extend to cover ends of the first layers of the electric charge storage layers.

11. The semiconductor device as claimed in claim 1, wherein each of the gate layers includes a gate electrode layer and a third dielectric layer surrounding the gate electrode layer.

12. The semiconductor device as claimed in claim 1, wherein at least a portion of the first dielectric layers is disposed between the interlayer insulating layers, the portion of the first dielectric layers overlapping the interlayer insulating layers in the first direction.

13. The semiconductor device as claimed in claim 1, further comprising at least one horizontal conductive layer, the at least one horizontal conductive layer extending horizontally on the substrate in a lower portion of the gate layers and the interlayer insulating layers, the at least one horizontal conductive layer directly contacting the channel layer.

14. The semiconductor device as claimed in claim 13, wherein the at least one horizontal conductive layer has a rounded end curved toward the channel layer.

15. A semiconductor device, comprising:
   gate layers vertically stacked on a substrate and spaced apart from each other;
   interlayer insulating layers alternately stacked with the gate layers on the substrate; and
   channel structures with channel holes, respectively, penetrating the gate layers and extending perpendicularly to the substrate, each channel structure including first dielectric layers, first electric charge storage layers, a second dielectric layer, and a channel layer stacked sequentially from side surfaces of the gate layers in a respective channel hole,
   wherein the first dielectric layers and the first electric charge storage layers are separated from each other between adjacent ones of the gate layers,
   wherein the first dielectric layers are on the side surfaces of the gate layers, such that the first dielectric layers do not extend to or contact side surfaces of the interlayer insulating layers, the side surfaces of the interlayer insulating layers facing a same direction as the side surfaces of the gate layers, and the first dielectric layers have rounded surfaces protruding and curved toward the channel layer, respectively, and
   wherein the first electric charge storage layers are on the rounded surfaces of the first dielectric layers.

16. The semiconductor device as claimed in claim 15, wherein a first distance from the side surfaces of the interlayer insulating layers to a central axis of the channel hole is greater than a second distance from side surfaces of the first dielectric layers facing the first electric charge storage layer to the central axis of the channel hole.

17. The semiconductor device as claimed in claim 15, wherein each of the channel structures further includes a second electric charge storage layer between the first dielectric layers and the first electric charge storage layers, the second electric charge storage layer extending to the side surfaces of the interlayer insulating layers.

18. The semiconductor device as claimed in claim 17, wherein the first dielectric layers are surrounded by the gate layers, the interlayer insulating layers, and the second electric charge storage layer.

19. The semiconductor device as claimed in claim 17, wherein each of the channel structures further includes an intermediate insulating layer on the second electric charge storage layer between the first dielectric layers vertically adjacent to each other.

20. A semiconductor device, comprising:
gate layers vertically stacked on a substrate and spaced apart from each other;
interlayer insulating layers alternately stacked with the gate layers on the substrate;
a channel layer penetrating the gate layers and extending perpendicularly to an upper surface of the substrate;
first dielectric layers on side surfaces of the gate layers, respectively, between the gate layers and the channel layer;
electric charge storage layers on side surfaces of the first dielectric layers, respectively, between the first dielectric layers and the channel layer; and
a second dielectric layer between the electric charge storage layers and the channel layer, the second dielectric layer being in contact with side surfaces of the interlayer insulating layers between the gate layers vertically adjacent to each other.

* * * * *